(12) United States Patent
Green et al.

(10) Patent No.: US 12,191,383 B2
(45) Date of Patent: Jan. 7, 2025

(54) SEMICONDUCTOR DEVICE WITH AN INSULATING REGION FORMED BETWEEN A CONTROL ELECTRODE AND A CONDUCTIVE ELEMENT AND METHOD OF FABRICATION THEREFOR

(71) Applicant: NXP USA, INC., Austin, TX (US)

(72) Inventors: Bruce Mcrae Green, Gilbert, AZ (US);
Ibrahim Khalil, Gilbert, AZ (US);
Bernhard Grote, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 412 days.

(21) Appl. No.: 17/561,796

(22) Filed: Dec. 24, 2021

(65) Prior Publication Data
US 2023/0207676 A1 Jun. 29, 2023

(51) Int. Cl.
*H01L 29/778* (2006.01)
*H01L 29/40* (2006.01)
*H01L 29/66* (2006.01)

(52) U.S. Cl.
CPC ........ *H01L 29/7786* (2013.01); *H01L 29/402* (2013.01); *H01L 29/66462* (2013.01)

(58) Field of Classification Search
CPC ............... H01L 29/7786; H01L 29/402; H01L 29/66462; H01L 29/0843; H01L 29/42316; H01L 29/2003; H01L 29/778
See application file for complete search history.

(56) References Cited

U.S. PATENT DOCUMENTS

| | | | |
|---|---|---|---|
| 9,024,324 B2 | 5/2015 | Teplik et al. | |
| 9,496,353 B2 | 11/2016 | Chini et al. | |
| 9,847,411 B2 | 12/2017 | Sriram et al. | |
| 2014/0061659 A1* | 3/2014 | Teplik | H01L 29/402 |
| | | | 257/E21.403 |

OTHER PUBLICATIONS

Definition of 'on' downloaded from URL< https://www.merriam-webster.com/dictionary/on> on July 3, 3024 (Year: 2024).*
Ando, Y. et al.; "10-W/mm AlGaN-GaN HFET With a Field Modulating Plate"; Published in IEEE Electron Device Letters ( vol. 24, Issue: 5, May 2003); DOI: 10.1109/LED.2003.812532.
(Continued)

*Primary Examiner* — J. E. Schoenholtz

(57) ABSTRACT

An embodiment of a semiconductor device includes a semiconductor substrate, a first dielectric layer, a first current-carrying electrode, and a second current-carrying electrode formed over the semiconductor substrate. A control electrode is formed over the semiconductor substrate and disposed between the first current-carrying electrode and the second current-carrying electrode. A conductive element formed over the first dielectric layer, adjacent the control electrode, and between the control electrode and the second current-carrying electrode, includes a first region formed a first distance from the upper surface of the semiconductor substrate and a second region formed a second distance from the upper surface of the semiconductor substrate. An insulating region is formed between the control electrode and the conductive element.

20 Claims, 15 Drawing Sheets

(56) References Cited

OTHER PUBLICATIONS

Asano, K. et al.; "Novel High Power AlGaAs/GaAs HFET with a Field-Modulating Plate Operated at 35V Drain Voltage"; Published in International Electron Devices Meeting 1998; Technical Digest (Cat. No. 98CH36217); Date of Conference: Dec. 6-9, 1998, San Francisco, CA; DOI: 10.1109/IEDM.1998.746246.

Vetury, R. et al.; "Performance and RF Reliability of GaN-on-SiC HEMT's using Dual-Gate Architectures"; Published in 2006 IEEE MTT-S International Microwave Symposium Digest; Date of Conference Jun. 11-16, 2006, San Francisco, CA; DOI: 10.1109/MWSYM.2006.249733.

* cited by examiner

SEMICONDUCTOR DEVICE WITH AN INSULATING REGION FORMED BETWEEN A CONTROL ELECTRODE AND A CONDUCTIVE ELEMENT AND METHOD OF FABRICATION THEREFOR

TECHNICAL FIELD

Embodiments of the subject matter described herein relate generally to semiconductor devices with conductive elements and methods for fabricating such devices.

BACKGROUND

Semiconductor devices find application in a wide variety of electronic components and systems. High power, high frequency transistors find application in radio frequency (RF) systems and power electronics systems. Gallium nitride (GaN) device technology is particularly suited for these RF power and power electronics applications due to its superior electronic and thermal characteristics. In particular, the high electron velocity and high breakdown field strength of GaN make devices fabricated from this material ideal for RF power amplifiers and high-power switching applications. Field plates are used to enhance the performance and reliability of high frequency transistors. Accordingly, there is a need for semiconductor and, in particular, GaN devices with field plates.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
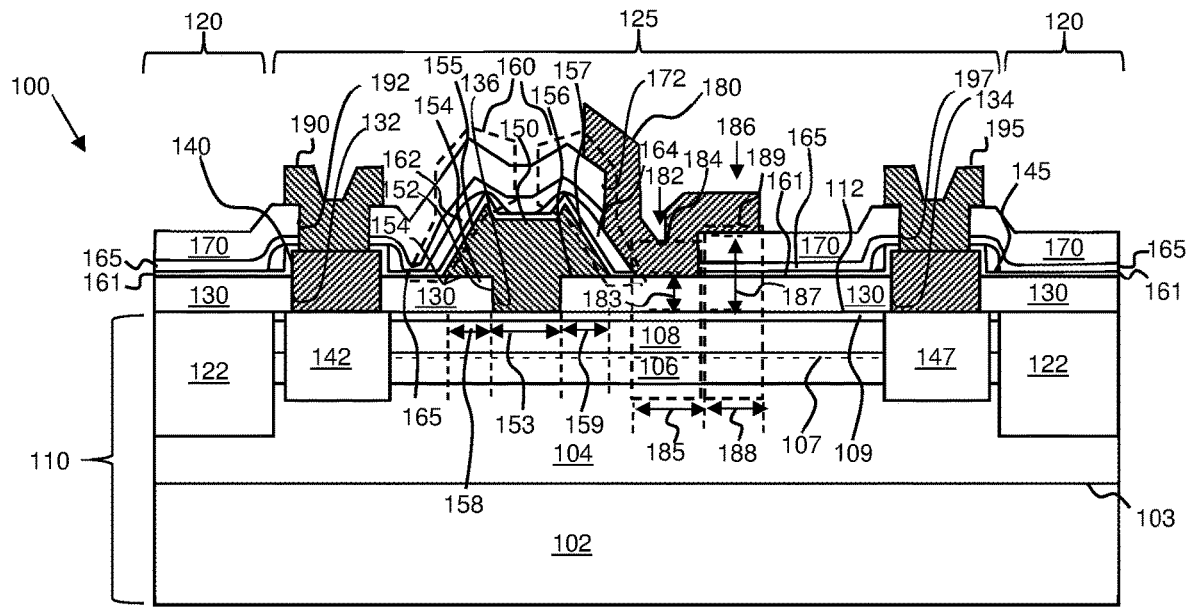
FIG. 1 is a cross-sectional, side view of an exemplary GaN heterojunction field effect transistor (HFET) in accordance with an embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary, or an example is not necessarily to be construed as preferred or advantageous over other implementations. Furthermore, there is no intention to be bound by any expressed or implied theory presented in the preceding technical field, background, or the following detailed description.

In one aspect, an embodiment of a semiconductor device may include a semiconductor substrate comprising an upper surface and a channel. A first dielectric layer may be disposed over the upper surface of the semiconductor substrate, according to an embodiment. In an embodiment, a first current-carrying electrode and a second current-carrying electrode may be formed over the semiconductor substrate, wherein the first current-carrying electrode and the second current-carrying electrode may be electrically coupled to the channel. A control electrode may be formed over the semiconductor substrate and disposed between the first current-carrying electrode and the second current-carrying electrode, wherein the control electrode is electrically coupled to the channel, according to an embodiment. In an embodiment, a conductive element may be formed over the first dielectric layer, adjacent the control electrode, and between the control electrode and the second current-carrying electrode, wherein the first conductive element may include a first region formed a first distance from the upper surface of the semiconductor substrate and a second region formed a second distance from the upper surface of the semiconductor substrate. An insulating region may be formed adjacent control electrode, wherein the insulating region may include a first portion formed laterally adjacent a first sidewall portion of the control electrode nearer the first current-carrying electrode and a second portion formed laterally adjacent a second sidewall portion of the control electrode, nearer the second current-carrying electrode, according to an embodiment. In an embodiment, the first portion and the second portion may be formed over the first dielectric layer, and the second portion may be formed between the control electrode and the conductive element.

In another aspect, an embodiment may include a gallium nitride field effect transistor device that may include a semiconductor substrate, comprising gallium nitride and further comprising an upper surface and a channel. A first dielectric layer may be disposed over the upper surface of the semiconductor substrate, according to an embodiment. In an embodiment, a source electrode and a drain electrode may be formed over the semiconductor substrate that include a first conductive layer formed within source and drain openings formed in the first dielectric layer, wherein the source electrode and the drain electrode may be electrically coupled to the channel. A gate electrode may be formed over the semiconductor substrate and disposed between the source electrode and the drain electrode, wherein the gate electrode may be electrically coupled to the channel, according to an embodiment. In an embodiment, a field plate may be formed over the first dielectric layer, adjacent the gate electrode, and between the gate electrode and the drain electrode, wherein the field plate further comprises a first region, parallel to the upper surface and formed a first distance from the upper surface of the semiconductor substrate, forming a first metal-insulator semiconductor region, and a second region, parallel to the upper surface and formed a second distance from the upper surface of the semiconductor substrate, forming a second metal-insulating semiconductor region. A spacer region may be formed adjacent the gate electrode, wherein the spacer region may include a first portion formed laterally adjacent a first sidewall portion of the gate electrode nearer the source electrode, and a second portion formed laterally adjacent a second sidewall portion of the gate electrode, nearer the drain electrode.

In still another aspect, the inventive subject matter may include a method of fabricating a gallium nitride field effect transistor device. An embodiment of the method may include forming a semiconductor substrate, comprising gallium nitride and further comprising an upper surface and a channel, and forming a first dielectric layer over the upper surface of the semiconductor substrate. In an embodiment, the method may include forming a source electrode and a drain electrode over the semiconductor substrate, wherein the source electrode and the drain electrode may be electrically coupled to the channel. The method may include forming a gate electrode over the semiconductor substrate between the source electrode and the drain electrode, wherein the gate electrode may be electrically coupled to the channel, according to an embodiment. In an embodiment, the method may include forming a field plate over the first dielectric layer, adjacent the gate electrode, between the gate electrode and the drain electrode. According to an embodiment, forming the field plate may include forming a first region, parallel to the upper surface and a first distance from the upper surface of the semiconductor substrate, wherein a first metal-insulator semiconductor region may be formed in the first region. In an embodiment, forming the field plate may include forming a second region, parallel to the upper surface and a second distance from the upper surface of the semiconductor substrate, wherein a second metal-insulating semiconductor region may be formed in the second region. The method may include forming a spacer region adjacent the gate electrode, wherein forming the spacer region may include forming a first portion laterally adjacent a first sidewall portion of the gate electrode nearer the source electrode, and forming a second portion laterally adjacent a second sidewall portion of the gate electrode, nearer the drain electrode, according to an embodiment.

FIG. 1 is a cross-sectional, side view of an exemplary GaN heterojunction field effect transistor (HFET) device 100 in accordance with an embodiment. In an embodiment, the GaN HFET device 100 may include a semiconductor substrate 110, one or more isolation regions 120, an active region 125, a first dielectric layer 130, a source electrode (i.e., "first current-carrying electrode") 140, a drain electrode (i.e., "second current-carrying electrode") 145, a gate electrode (i.e., "control electrode") 150, a spacer region (i.e. "insulating region"), 160, a first etch stop layer 161, a second etch stop layer 165, a second dielectric layer 170, a field plate opening 172, and a field plate (i.e., "first conductive element") 180. As is described more fully below, the GaN HFET device 100 may be substantially contained within the active region 125 defined by the isolation regions 120, with the first dielectric layer 130, the source electrode 140, drain electrode 145, gate electrode 150, spacer region 160, and field plate 180 disposed over the semiconductor substrate 110.

In an embodiment, the GaN HFET device 100 may include a semiconductor substrate 110, comprising gallium nitride and further comprising an upper surface 112 and a channel 107. A first dielectric layer 130 may be disposed over the upper surface 112 of the semiconductor substrate 110, according to an embodiment. In an embodiment, the source electrode 140 and the drain electrode 145 may be formed over the semiconductor substrate 110, wherein the source electrode 140 and the drain electrode 145 may be electrically coupled to the channel 107. A gate electrode 150 may be formed over the semiconductor substrate 110 and disposed between the source electrode 140 and the drain electrode 145, wherein the gate electrode 150 may be electrically coupled to the channel 107, according to an embodiment. In an embodiment, the field plate 180 may be formed over the first dielectric layer 130, adjacent the gate electrode 150, and between the gate electrode 150 and the drain electrode 145, wherein the field plate 180 may include a first region 182, parallel to the upper surface 112, formed a first distance 183 from the upper surface 112 of the semiconductor substrate, forming a first metal-insulator semiconductor region 184, and a second region 186, parallel to the upper surface 112, formed a second distance 187 from the upper surface 112 of the semiconductor substrate, forming a second metal-insulating semiconductor region 189. A spacer region 160 may be formed adjacent the gate electrode 150, wherein the spacer region 160 may include a first spacer portion (i.e., "first portion") 162 formed laterally adjacent a first sidewall portion 155 of the gate electrode 150 nearer the source electrode 140, and a second spacer portion (i.e., "second portion") 164 formed laterally adjacent a second sidewall portion 157 of the gate electrode 150, nearer the drain electrode 145.

In an embodiment, the semiconductor substrate 110 may include a host substrate 102, a buffer layer 104 disposed over the host substrate 102, a channel layer 106 disposed over the buffer layer 104, a barrier layer 108 disposed over the channel layer 106, and a cap layer 109 disposed over the channel layer 106. In an embodiment, the host substrate 102 may include silicon carbide (SiC). In other embodiments, the host substrate 102 may include other materials such as sapphire, silicon (Si), GaN, aluminum nitride (AlN), diamond, poly-SiC, silicon on insulator, gallium arsenide (GaAs), indium phosphide (InP), and other substantially insulating or high resistivity materials. A nucleation layer (not shown) may be formed on an upper surface 103 of the host substrate 102 between the buffer layer 104 and the host substrate 102. In an embodiment, the nucleation layer may include AlN. The buffer layer 104 may include a number of group III-N semiconductor layers and is supported by the host substrate 102. Each of the semiconductor layers of the buffer layer 104 may include an epitaxially grown group III-nitride epitaxial layer. The group-III nitride epitaxial layers that make up the buffer layer 104 may be nitrogen (N)-face or gallium (Ga)-face material, for example. In other embodiments, the semiconductor layers of the buffer layer 104 may not be epitaxially grown. In still other embodiments, the semiconductor layers of the buffer layer 104 may include Si, GaAs, InP, or other suitable materials.

In an embodiment, the buffer layer 104 may be grown epitaxially over the host substrate 102. The buffer layer 104 may include at least one AlGaN mixed crystal layer having a composition denoted by $Al_XGa_{1-X}N$ with an aluminum mole fraction, X, that can take on values between 0 and 1. The total thickness of the buffer layer 104 with all of its layers may be between about 200 angstroms and about 100,000 angstroms although other thicknesses may be used. A limiting X value of 0 yields pure GaN while a value of 1 yields pure aluminum nitride (AlN). An embodiment may include a buffer layer 104 disposed over the host substrate and nucleation layer (not shown). The buffer layer 104 may include additional $Al_XGa_{1-X}N$ layers. The thickness of the additional $Al_XGa_{1-X}N$ layer(s) may be between about 200 angstroms and about 50,000 angstroms though other thicknesses may be used. In an embodiment, the additional $Al_XGa_{1-X}N$ layers may be configured as GaN (X=0) where the $Al_XGa_{1-X}N$ is not intentionally doped (NID). The additional $Al_XGa_{1-X}N$ layers may also be configured as one or more GaN layers where the one or more GaN layers are intentionally doped with dopants that may include iron (Fe), chromium (Cr), carbon (C) or other suitable dopants that render the buffer layer 104 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, or other suitable dopant species. In other embodiments (not shown), the additional layers may be configured as a superlattice where the additional layers include a series of alternating NID or doped $Al_XGa_{1-X}N$ layers where the value of X takes a value between 0 and 1. In still other embodiments, the buffer layer 104 may also include one or more indium gallium nitride (InGaN) layers, with composition denoted $In_YGa_{1-Y}N$, where Y, the indium mole fraction, may take a value between 0 and 1. The thickness of the InGaN layer(s) may be between about 50 angstroms and about 2,000 angstroms, though other thicknesses may be used.

In an embodiment, a channel layer 106 may be formed over the buffer layer 104. The channel layer 106 may include one or more group III-N semiconductor layers and may be supported by the buffer layer 104. The channel layer 106 may include an $Al_XGa_{1-X}N$ layer where X takes on values between 0 and 1. In an embodiment, the channel layer 106 is configured as GaN (X=0) although other values of X may be used without departing from the scope of the inventive subject matter. The thickness of the channel layer 106 may be between about 50 angstroms and about 10,000 angstroms though other thicknesses may be used. The channel layer 106 may be NID or, alternatively, may include Si, germanium (Ge), C, Fe, Cr, or other suitable dopants. The dopant concentration may be between about $10^{15}$ cm$^{-3}$ and about $10^{19}$ cm$^{-3}$ though other higher or lower concentrations may be used. In other embodiments, the channel layer 106 may include NID or doped $In_YGa_{1-Y}N$, where Y, the indium mole fraction, may take a value between 0 and 1.

A barrier layer 108 may be formed over the channel layer 106 in accordance with an embodiment. The barrier layer 108 may include one or more group III-N semiconductor layers and is supported by the channel layer 106. In some embodiments, the barrier layer 108 has a larger bandgap and larger spontaneous polarization than the channel layer 106 and, when the barrier layer 108 is in direct contact with the channel layer 106, a channel 107 is created in the form of a two-dimensional electron gas (2-DEG) within the channel layer 106 near the interface between the channel layer 106 and barrier layer 108. In addition, strain between the barrier layer 108 and channel layer 106 may cause additional piezoelectric charge to be introduced into the 2-DEG and channel 107. The barrier layer 108 may include at least one NID $Al_XGa_{1-X}N$ layer where X takes on values between 0 and 1. In some embodiments, X may take a value of 0.1 to 0.35, although other values of X may be used. The thickness of the barrier layer 108 may be between about 50 angstroms and about 1,000 angstroms though other thicknesses may be used. The barrier layer 108 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. In an embodiment, an additional AlN interbarrier layer (not shown) may be formed between the channel layer 106 and the barrier layer 108, according to an embodiment. The AlN interbarrier layer may increase the channel charge and improve the electron confinement of the resultant 2-DEG. In other embodiments, the barrier layer 108 may include indium aluminum nitride (InAlN) layers, denoted $In_YAl_{1-Y}N$, where Y, the indium mole fraction, may take a value between about 0.1 and about 0.2 though other values of Y may be used. In the case of an InAlN barrier, the thickness of the barrier layer 108 may be between about 30 angstroms and about 1,000 angstroms though other thicknesses may be used. In the case of using InAlN to form the barrier layer 108, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In an embodiment illustrated in FIG. 1, a cap layer 109 may be formed over the barrier layer 108. The cap layer 109 may present a stable surface for the semiconductor substrate 110 and may protect the surface of the semiconductor substrate 110 from chemical and environmental exposure incident to wafer processing. The cap layer 109 may include one or more group III-N semiconductor layers and is supported by the barrier layer 108. In an embodiment, the cap layer 109 is GaN. The thickness of the cap layer 109 may be between about 5 angstroms and about 100 angstroms though other thicknesses may be used. The cap layer 109 may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used. Without departing from the scope of the inventive subject matter, it should be appreciated that the choice of materials and arrangement of layers to form the semiconductor substrate 110 is exemplary. It should be appreciated that the inclusion of the host substrate 102, the buffer layer 104, the channel layer 106, the barrier layer 108, and the cap layer 109 into the semiconductor substrate 110 is exemplary and that the function and operation of the various layers may be combined and may change depending on the materials used in any specific embodiment. For example, in some embodiments, the cap layer 109 may be omitted (not shown). In other embodiments using N-polar materials, the channel layer 106 may be disposed over the barrier layer 108 to create a 2-DEG and channel 107 directly beneath the cap layer 109 and the gate electrode 150 (not shown). Still further embodiments may include semiconductor layers formed from materials including GaAs, gallium oxide ($Ga_2O_3$) aluminum gallium arsenide (AlGaAs), indium gallium arsenide (InGaAs), and aluminum indium arsenide (AlInAs) to form the semiconductor substrate 110.

One or more isolation regions 120 may be formed in the semiconductor substrate 110 to define an active region 125 above and along the upper surface 103 of the host substrate 102, according to an embodiment. The isolation regions 120 may be formed via an implantation procedure configured to damage the epitaxial and/or other semiconductor layers to create high resistivity regions 122 of the semiconductor substrate 110 rendering the semiconductor substrate 110 high resistivity or semi-insulating in those high resistivity regions 122 while leaving the crystal structure intact in the active region 125. In other embodiments, the isolation regions 120 may be formed by removing one or more of the epitaxial and/or other semiconductor layers of the semiconductor substrate 110 rendering the remaining layers of the semiconductor substrate 110 semi-insulating and leaving behind active region 125 "mesas" surrounded by high resistivity or semi-insulating isolation regions 120 (not shown). In still other embodiments, the isolation regions 120 may be formed by removing one or more of the epitaxial and/or other semiconductor layers of the semiconductor substrate 110 and then using ion implantation to damage and further enhance the semi-insulating properties of the remaining layers of the semiconductor substrate 110 and leaving behind active region 125 "mesas" surrounded by high resistivity or semi-insulating isolation regions 120 that have been implanted (not shown). In an embodiment, a first dielectric layer 130 may be formed over the active region 125 and isolation regions 120. In an embodiment, the first dielectric layer 130 may be formed from one or more suitable materials including silicon dioxide ($SiO_2$), tetraethyl orthosilicate (TEOS), silicon nitride (SiN), silicon oxynitride (SiON), aluminum oxide ($Al_2O_3$), aluminum nitride (AlN), and hafnium oxide ($HfO_2$), though other substantially insulating materials may be used. In an embodiment, the first dielectric layer 130 may have a thickness of between 200 angstroms and 1,000 angstroms. In other embodiments, the first dielectric layer 130 may have a thickness of between 50 angstroms and 10,000 angstroms, though other thicknesses may be used.

In an embodiment, the source electrode 140 and the drain electrode 145 may be formed over and contact source and drain regions 142, 147 formed in semiconductor substrate 110 in the active region 125. The source electrode 140 and the drain electrode 145 may be formed inside a source opening 132 and a drain opening 134 formed in the first dielectric layer 130 and may be formed from one or more conductive layers. In some embodiments, ion implantation may be used to form ohmic contact to the channel 107 to create source and drain regions 142, 147. In an embodiment, the one or more conductive layers used to form source and drain electrodes 140, 145 may include titanium (Ti), Gold (Au), Al, molybdenum (Mo), nickel (Ni), Si, Ge, platinum (Pt), tantalum (Ta), or other suitable materials. In other embodiments, the one or more conductive layers used to form source and drain electrodes 140, 145 may include titanium-tungsten (TiW), titanium-aluminum (TiAl), or titanium-tungsten nitride (TiWN). In an embodiment, the source electrode 140 and the drain electrode 145 may be formed over and in contact with the cap layer 109. In other embodiments (not shown), one or both of the source electrode 140 and the drain electrode 145 may be recessed through the cap layer 109 and extend partially through the barrier layer 108. In an embodiment, the source electrode 140 and the drain electrode 145 may be formed from a multi-layer stack. In an embodiment, the multi-layer stack used to form the source electrode 140 and the drain electrode 145 may include an adhesion layer and one or more layers, that when annealed, allows an ohmic contact to form between the channel 107 and the source and drain regions 142, 147. In an embodiment, the adhesion layer may include titanium (Ti), tantalum (Ta), silicon (Si), or other suitable materials. In an embodiment, the adhesion layer may have a work function that is below 4.5 electron-volts.

In an embodiment, the gate electrode 150 may be formed over the semiconductor substrate 110 in the active region 125. The gate electrode 150 may include a vertical stem 152, a first protruding region 154 coupled to the vertical stem 152 over the first dielectric layer 130 and toward the source electrode, according to an embodiment. The first protruding region may include a first sidewall portion 155 that may extend upward and away from the semiconductor substrate at the point of the first protruding region 154 closest to the source electrode 140, according to an embodiment. In an embodiment a second protruding region 156 may couple to the vertical stem 152 and may be formed over the first dielectric layer 130 and toward the drain electrode 145. The second protruding region 156 may include a second sidewall portion 157 that extends upward and away from the semiconductor substrate at the point of the second protruding region 154, closest to the source electrode 140, according to an embodiment. In an embodiment, the gate electrode 150 may be electrically coupled to the channel 107 through the cap layer 109 and the barrier layer 108. Changes to the electric potential applied to the gate electrode 150 may shift the quasi Fermi level for the barrier layer 108 with respect to the quasi Fermi level for the channel layer 106 and thereby modulate the electron concentration in the channel 107 within the semiconductor substrate 110 under the gate electrode 150. One or more Schottky materials such as Ni, Pd, Pt, iridium (Ir), or Copper (Cu), may be combined with one or more of low stress conductive materials such as Au, Al, Cu, poly Si, or other suitable material(s) in a metal stack to form a gate electrode 150 for a low-loss, Schottky gate electrode 150 electrically coupled to channel 107, according to an embodiment. In an embodiment, the gate electrode 150 may be formed, wherein the vertical stem 152 is formed within a gate opening 136 in the first dielectric layer 130.

In an embodiment, the gate electrode 150 may be characterized by a gate length 153 within the gate opening 136 and first and second protruding region lengths 158 and 159 where the first and second protruding regions 154 and 156 may overlay the first dielectric layer 130. In an embodiment, the gate length 153 may be between about 0.1 microns and about 1 micron. In other embodiments, the gate length 153 may be between about 0.02 microns and about 5 microns, though other suitable dimensions may be used. In an embodiment, the first protruding region length 158 may be between about 0.05 microns and about 0.5 microns. In other embodiments, the first protruding region length 158 may be between about 0.01 microns and 5 microns, though other suitable dimensions may be used. In an embodiment, a second protruding region length 159 may be between about 0.05 microns and about 0.5 microns. In other embodiments, the second protruding region length 159 may be between 0.01 microns and 2 microns, though other suitable lengths may be used.

Without departing from the scope of the inventive subject matter, numerous other embodiments may be realized. The exemplary embodiment of FIG. 1 depicts the gate electrode 150 as T-shaped with a vertical stem 152 and first and second protruding regions 154, 156 disposed over the first dielectric layer 130. In other embodiments, the gate electrode 150 may be a square shape with no protruding regions (e.g., 154 and 156) over the first dielectric layers 130. In other embodiments (not shown), the gate electrode 150 may be recessed through the cap layer 109 and extend partially into the barrier layer 108, increasing the electrical coupling of the gate electrode 150 to the channel 107 through the barrier layer 108. In other embodiments (not shown), the cap layer 109 may be omitted and the gate electrode 150 may contact the barrier layer directly (not shown). In still other embodiments, the gate electrode 150 may be disposed over a gate dielectric that is formed between the gate electrode 150 and the semiconductor substrate 110 to form a metal-insulator semiconductor field effect transistor (MISFET) device (not shown).

According to an embodiment, a spacer region 160 may be formed over a portion of the first dielectric layer 130 and first and second sidewall portions 155, 157 of the gate electrode 150. The spacer region 160 may include a first etch stop layer 161, first and second spacer portions 162, 164, and a second etch stop layer 165. The first spacer portion 162 may be formed laterally adjacent a first sidewall portion 155 of the gate electrode 150 nearer the source electrode 140 and a second spacer portion 164 formed laterally adjacent a second sidewall portion 157 of the gate electrode 150, nearer the drain electrode 145, wherein the first spacer portion 162 and the second spacer portion 164 may be formed over the first etch stop layer 161 over the first sidewall portion 155 of the gate electrode 150 and the first dielectric layer 130, and wherein the second spacer portion 164 may be formed over the first etch stop layer 161 and between the second sidewall portion 157 of the gate electrode 150 and the field plate 180, according to an embodiment.

The first etch stop layer 161 may be formed over the first dielectric layer 130, the gate electrode 150, and between the gate electrode 150 and the first and second spacer portions 162, 164, according to an embodiment. In an embodiment, the first etch stop layer 161 may be designed in conjunction with the first and second spacer portions 162, 164 and may include one or more dielectric layers that may include $Al_2O_3$, SiN, AlN, $SiO_2$, TEOS, $HfO_2$, or other suitable dielectric layers. The first etch stop layer 161 may be configured to have a low etch rate to etchants used to etch the material used to form the first and second spacer portions 162, 164, according to an embodiment. In an exemplary embodiment, the first etch stop layer 161 may include a dielectric material, e.g., $Al_2O_3$ or AlN, that resists etching by fluorine (F)-based chemistry used to etch the material, e.g., SiN, TEOS, or $SiO_2$, used to form the first and second spacer portions 162, 164. The thickness of the first etch stop layer 161 may between about 100 angstroms and about 500 angstroms in some embodiments. In other embodiments, the thickness of the first etch stop layer 161 may between about 50 angstroms and about 2,000 angstroms, though other thicker or thinner layers may be used.

The first and second spacer portions 162, 164 may be formed over the first etch stop layer 161 along the first and second sidewall portions 155, 157 of the gate electrode 150, according to an embodiment. In an embodiment, the first and second spacer portions 162, 164 may be formed using SiN, TEOS, or $SiO_2$ or other suitable dielectric material(s). As will be described in connection with FIG. 11B, the first and second spacer portions 162, 164 may be formed by anisotropic etching of a blanket dielectric layer, leaving behind the first and second spacer portions 162, 164. The thickness of the first and second spacer portions 162, 164 may vary from the top to the bottom of the first and second sidewall portions 155, 157. In an embodiment, a maximum spacer thickness may be achieved at the bottom of the first and second sidewall portions 155, 157 and a minimum spacer thickness may be achieved at the top of the first and second sidewall portions 155, 157. In an embodiment, the maximum spacer thickness (i.e., thickness at a widest point, e.g., at the bottom of the first and second sidewall portions 155, 157) may be between about 1,000 angstroms and about 5,000 angstroms, according to an embodiment. In other embodiments, the maximum thickness may be between about 100 angstroms and about 10,000 angstroms, according to an embodiment. In an embodiment, the minimum thickness (i.e., thickness at a widest point, e.g., at the top of the first and second sidewall portions 155, 157) may be between about 200 angstroms and about 4,000 angstroms, according to an embodiment. In other embodiments, the maximum thickness may be between about 50 angstroms and about 8,000 angstroms, according to an embodiment.

In an embodiment, the second etch stop layer 165 may be formed over the first etch stop layer 161 and over the first and second spacer portions 162, 164. The materials and thicknesses of the second etch stop layer 165 may be analogous to those of the first etch stop layer 161, according to an embodiment.

A second dielectric layer 170 may be formed over the second etch stop layer 165 and over the gate electrode 150, according to an embodiment. In an embodiment, the second dielectric layer 170 may include one or more of SiN, $SiO_2$, AlN, $HfO_2$, $Al_2O_3$, spin on glass, or other suitable insulating materials. In an embodiment, the second dielectric layer 170 may have a thickness of between about 500 angstroms and about 5,000 angstroms. In other embodiments, the second dielectric layer 170 may have a thickness between about 100 angstroms and about 20,000 angstroms.

A field plate opening (i.e., "conductive element opening") 172 may be formed in the second dielectric layer 170 over a portion of the first dielectric layer 130 and over at least a portion of the spacer region 160. The field plate opening 172 may also include an opening in the second etch stop layer 165 along the second sidewall portion 157 and over the first dielectric layer 130 in the first region 182 of the field plate 180, according to an embodiment. In an embodiment, the field plate opening 172 may include an opening in the first etch stop layer in the first region 182 of the field plate 180. In other embodiments, the first and second etch stops 161, 165 may not be opened in the field plate opening 172.

In an embodiment, the field plate 180 may be formed within at least a portion of the field plate opening 172 and over the first dielectric layer 130, adjacent the gate electrode 150, and between the gate electrode 150 and the drain electrode 145. In an embodiment, the field plate 180 may be formed using suitable conductive materials. Suitable materials for forming the field plate 180 include, but are not limited to, Al, Au, TiW, TiWN, Cu, and other conductive materials. The thickness of the field plate 180 may be between about 1,000 angstroms and about 20,000 angstroms in some embodiments. In other embodiments, the thickness of the field plate may be between about 250 angstroms and about 40,000 angstroms in other embodiments, although thicker or thinner materials may be used.

The field plate 180 may be characterized by a first field plate length 185 in the first region 182 and by a second field plate length 188 in the second region 186, according to an embodiment. In an embodiment, the field plate 180 may also be characterized by the thickness of the second spacer portion 164 that sets the distance from the second sidewall portion 157 of the gate electrode 150 to the field plate 180. In an embodiment, the field plate 180 may reduce the electric field and gate-drain feedback capacitance between the gate electrode 150 and the drain electrode 145.

The first metal-insulator-semiconductor region 184 may be created by first region 182 of the field plate 180, the underlying first dielectric layer 130, any additional dielectrics between the first dielectric layer 130 and the field plate 180, and the semiconductor substrate 110, according to an embodiment. In an embodiment, the surface of the first region 182 in contact with the first dielectric layer has a first distance 183 from the upper surface of the semiconductor substrate, forming the first metal-insulator semiconductor region 184. In an embodiment, the first distance 183 may be between about 100 angstroms and about 3,000 angstroms. In other embodiments, the first distance 183 may be between about 50 angstroms and about 10,000 angstroms, although thicker or thinner values may be used. In an embodiment, the first metal-insulator-semiconductor region 184 may act as part of the active device and has a first threshold voltage, dependent on the thickness of the first dielectric layer 130 (and any additional dielectric layers between the field plate 180 and the semiconductor substrate 110) and the amount of charge in channel 107. In an embodiment, the first threshold voltage may be between −5 volts and −15 V. In other embodiments, the first threshold voltage may be between about −4 volts and about −50 volts.

The second metal-insulator-semiconductor region 189 may be created by the field plate 180 in the second region 186, the second dielectric layer 170, the first dielectric layer 130, any additional dielectrics between the first dielectric layer 130 and the field plate 180, and the semiconductor substrate 110, according to an embodiment. In an embodiment, the surface of the second region 186 in contact with the first dielectric layer 130 has a second distance 187 from the upper surface of the semiconductor substrate, forming the first metal-insulator semiconductor region 184. In an embodiment, the first distance 183 may be between about 100 angstroms and about 3,000 angstroms. In other embodiments, the second distance 187 may be between about 100 angstroms and about 40,000 angstroms, although thicker or thinner values may be used. In an embodiment, the second metal-insulator-semiconductor region 189 may act as part of the active device and has a second threshold voltage, dependent on the thickness of the first dielectric layer 130, the second dielectric layer 170, (and any additional dielectric layers between the field plate and the semiconductor substrate 110) and the amount of charge in channel 107. In an embodiment, the second threshold voltage may be between −10 volts and −50 V. In other embodiments, the second threshold voltage may be between about −5 volts and about −150 volts.

In an embodiment, GaN HFET device 100 may be configured as a transistor finger wherein the source electrode 140, the drain electrode 145, gate electrode 150, and the field plate 180 may be configured as elongated elements forming a gate finger. The GaN HFET device 100 may be defined, in part, by isolation regions 120 in which a gate width of the gate finger (i.e., a dimension extending along an axis perpendicular to the plane of GaN HFET device 100 of FIG. 1 is significantly larger than the gate length 153 of the gate electrode 150 (i.e., a dimension extending along an axis that is perpendicular to the width). In some embodiments, the gate width may be between about 50 microns and about 500 microns. In other embodiments, the gate width may be between about 5 microns and about 1,000 microns. In an embodiment, the field plate 180 may be electrically coupled to the same potential as the source electrode 140. The field plate 180 may be connected to the source electrode 140 using connections formed from extensions of the conductive material used to form the field plate 180 at one or more ends of device fingers in the isolation region 120 to the source electrode 140 (not shown).

In an embodiment, source and drain metallization 190, 195 may be formed in source and drain metallization openings 192, 197 formed in the second dielectric layer 170 and first and second etch stops 161, 165. In some embodiments, the source and drain metallization 190, 195 may be formed in a separate metal layer than the field plate 180. In other embodiments (not shown), the source and drain metallization 190, 195 may be formed using the same metal layer as the field plate 180. Without departing from the scope of the inventive subject matter, other embodiments (not shown) may include additional dielectric layers, metal layers, and other features that may be formed above or adjacent to the GaN HFET 100 of FIG. 1.

Figure 2:
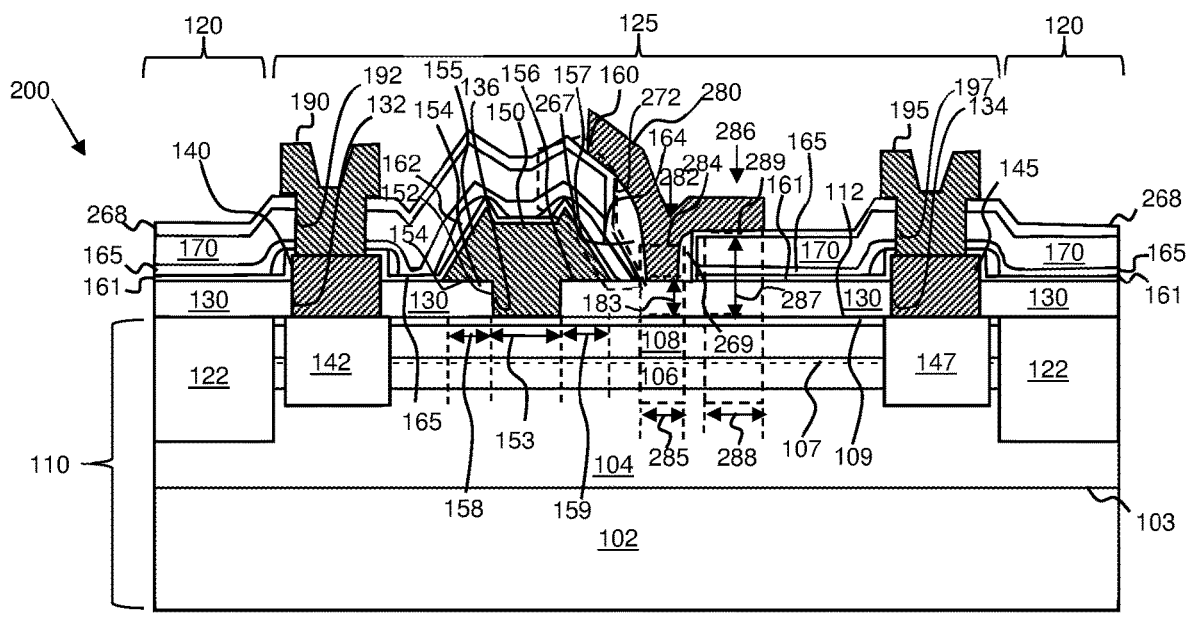
FIG. 2 is a cross-sectional, side view of an exemplary GaN heterojunction field effect transistor (HFET) in accordance with an embodiment.

FIG. 2 is a cross-sectional, side view of an exemplary GaN heterojunction field effect transistor (HFET) 200 in accordance with an embodiment of the inventive subject matter. In an embodiment, the GaN HFET device 200 may include a semiconductor substrate 110, an isolation region 120, an active region 125, a first dielectric layer 130, a source electrode 140, a drain electrode 145, a gate electrode 150, a first etch stop layer 161, a second etch stop layer 165, a third etch stop layer 268, spacer portions 162, 164, a second dielectric layer 170, and a field plate 280. As is described in connection with the GaN HFET device 100 of FIG. 1, the GaN HFET device 200 may be substantially contained within the active region 125 defined by the isolation region 120, with the first dielectric layer 130, the source electrode 140, drain electrode 145, gate electrode 150, second dielectric layer 170, and field plate 280 disposed over the semiconductor substrate 110.

FIG. 2 is a cross-sectional, side view of an exemplary GaN heterojunction field effect transistor (HFET) device 200 in accordance with an embodiment. In an embodiment, the GaN HFET device 100 may include a semiconductor substrate 110, one or more isolation regions 120, an active region 125, a first dielectric layer 130, a source electrode 140, a drain electrode 145, a gate electrode 150, a spacer region 160, a second dielectric layer 170, a third etch stop layer 268, inside spacers 267, 269, a field plate opening 272, and a field plate 280. As is the case for the GaN HFET device 100 of FIG. 1, the GaN HFET device 200 may be substantially contained within the active region 125 defined by the isolation regions 120, with the first dielectric layer 130, the source electrode 140, drain electrode 145, gate electrode 150, spacer region 160, and field plate 180 disposed over the semiconductor substrate 110.

In an embodiment, a third etch stop layer 268 may be formed over the second dielectric layer 170, the source and drain electrodes 140, 145, the gate electrode 150, and within a portion of the field plate opening 272. In an exemplary embodiment, and analogous to the first etch stop layer 161, the third etch stop layer 268 may include a dielectric material, e.g., $Al_2O_3$ or AlN, that resists etching by fluorine (F)-based chemistry used to etch the material, e.g., SiN, TEOS, or $SiO_2$, used to form the spacer portions 162, 164. The thickness of the third etch stop layer 268 may between about 100 angstroms and about 500 angstroms in some embodiments. In other embodiments, the thickness of the third etch stop layer 268 may between about 50 angstroms and about 2,000 angstroms, though other thicker or thinner layers may be used.

In an embodiment, the inside spacers 267, 269 may be formed over a portion of the third etch stop layer 268 within the field plate 272 opening where the third etch stop layer 268 contacts the spacer region 160 and a sidewall of the second dielectric layer 170. The inside spacer portions 267, 269 may reduce the first field plate length 285 to a smaller length than that of first field plate length 185 of GaN HFET 100 of FIG. 1. The inside spacer layers make it possible to reduce the first field plate length 285, according to an embodiment. In an embodiment, the reduction of first field plate length 285 compared to first field plate length 185 may be approximately between one to two times the combined thickness of second dielectric layer 170 and the first and second etch stop layers 161, 165. For example, if the combined thickness of second dielectric layer 170 and the first and second etch stop layers 161, 165 is 1,000 angstroms, then it may be possible to reduce the first field plate length 285 by approximately 2,000 angstroms. In other embodiments, the amount of reduction in the first field plate length 285 may be more or less than a factor of two. In addition, the inside spacers 267, 269 may increase the distance between the gate electrode 150 and the field plate 280 compared to the GaN HFET 100 of FIG. 1. In an embodiment, the inside spacers 267, 269 may be formed using one or more insulating layers analogous to those used to form the spacer portions 162, 164 of FIG. 1 (e.g., TEOS, $SiO_2$, or other suitable material(s)).

Figure 3:
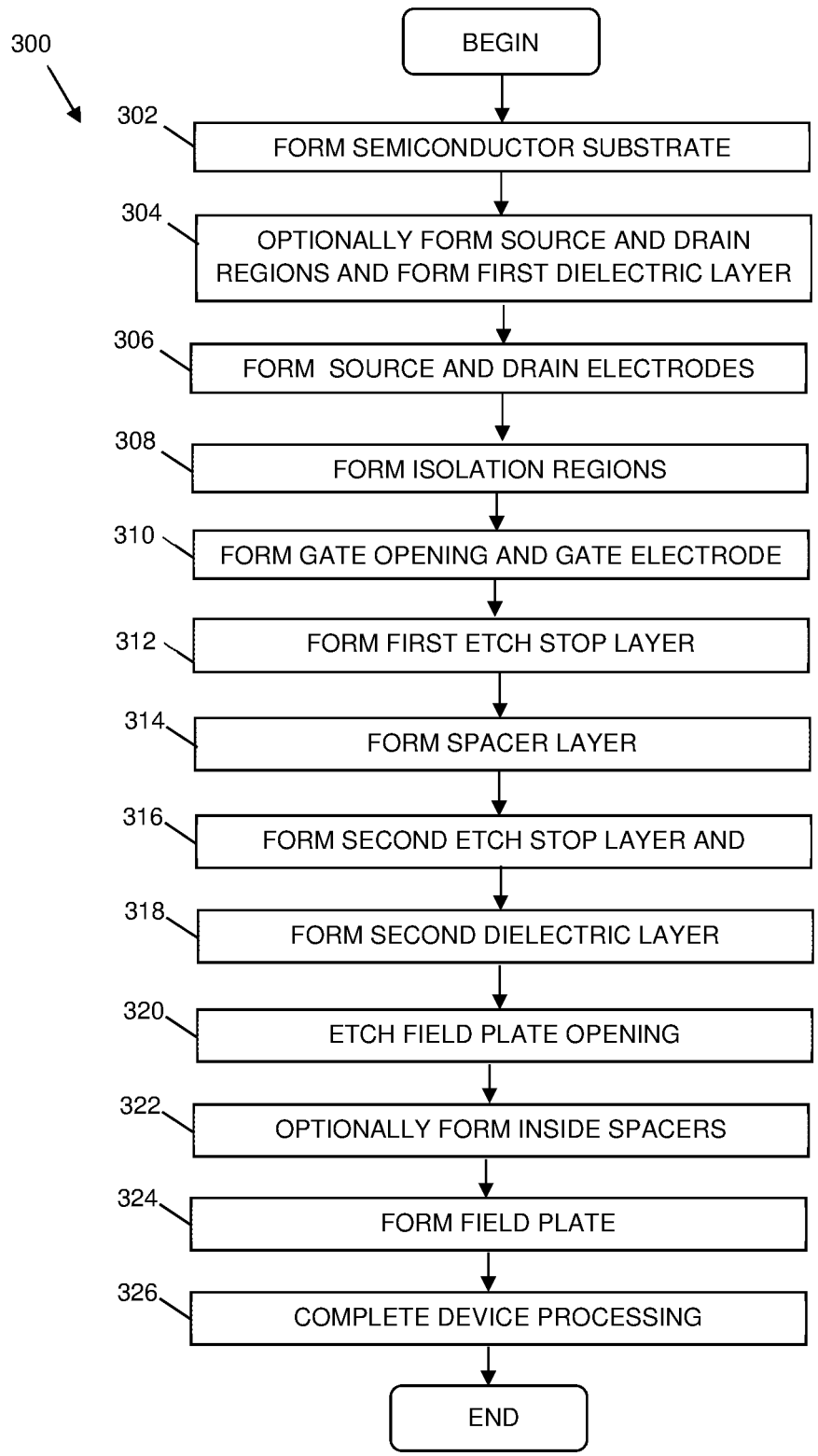
FIG. 3 is a process flow diagram describing a method for fabricating the GaN heterojunction field effect transistor (HFET) devices of FIGS. 1-2 in accordance with an embodiment.

The flowchart 300 of FIG. 3 describes embodiments of methods for fabricating semiconductor devices (e.g., GaN HFET devices 100, 200 FIGS. 1-2). FIG. 3 should be viewed alongside FIGS. 4, 5, 6, 7A, 7B, 7C, 8, 9A, 9B, 10, 11A, 11B, 11C, 12, 13, 14A, 14B, 15A, 15, 16A, 16B, 17A, and 17B which illustrate cross-sectional, side views of a series of fabrication steps for producing the semiconductor devices of FIGS. 1-2, in accordance with an example embodiment.

Figure 4:
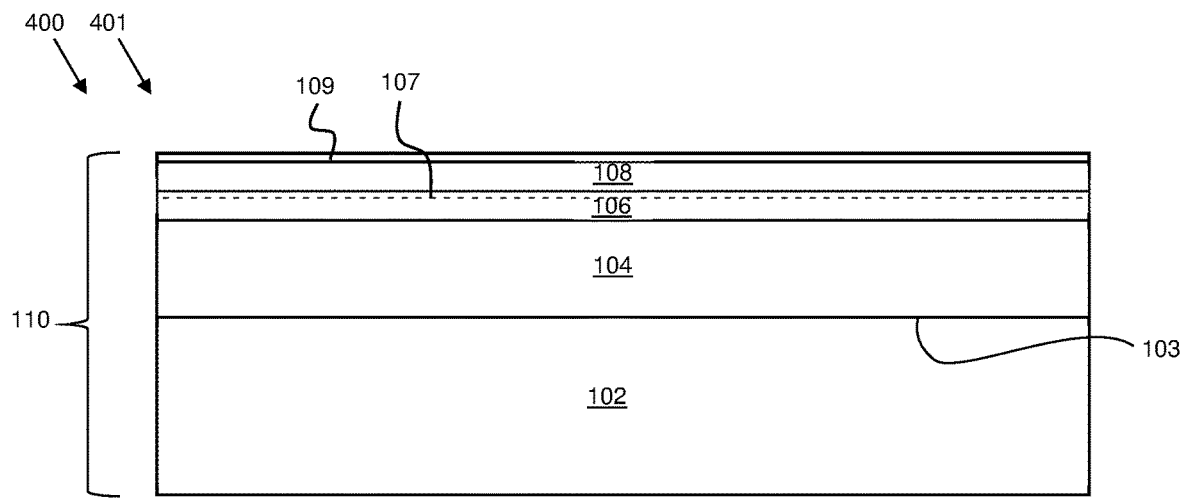
FIG. 4 is a cross-sectional, side view of a fabrication step for producing a GaN HFET device, in accordance with embodiments of the method of fabrication.

In block 302 of FIG. 3, and as depicted in the step 400 of FIG. 4, an embodiment of the method may include forming a semiconductor substrate 110. In an embodiment, the step 500 may include providing a host substrate 102 and forming a number of semiconductor layers on or over the host substrate 102. In an embodiment, the host substrate 102 may include SiC, or may include other materials such as sapphire, Si, GaN, AlN, diamond, poly-SiC, silicon on insulator, GaAs, InP, or other substantially insulating or high resistivity materials. Forming the semiconductor layers may include forming a nucleation layer (not shown) on or over an upper surface 103 of the host substrate 102, forming a buffer layer 104 on or over the nucleation layer, forming the channel layer 106 on or over the buffer layer 104, forming the barrier layer 108 on or over the channel layer 106, and forming the cap layer 109 on or over the barrier layer 108. As discussed previously, embodiments of the buffer layer 104, the channel layer 106, the barrier layer 108, and the cap layer 109 may include materials selected from AlN, GaN, AlGaN, InAlN, InGaN, or other suitable materials. The semiconductor layers 104, 106, 108, and 109 may be grown using one of metal-organo chemical vapor deposition (MOCVD), molecular beam epitaxy (MBE), hydride-vapor phase epitaxy (HVPE) or a combination of these techniques, although other suitable techniques may alternatively be used. Semiconductor substrate 110 results.

In block 304 of FIG. 3, and as depicted in steps 500, 502, 504, and 506 of FIGS. 5A, 5B, 5C, and 5D, an embodiment of the method may optionally include forming doped (e.g., ion-implanted) source and drain regions 142 and 147. As depicted in a step 500 of FIG. 5A, forming source and drain regions 142 and 147 may include forming a sacrificial dielectric layer 510 on or over the semiconductor substrate 110. As discussed previously, in an embodiment, the sacrificial dielectric layer 510 may include materials selected from SiN, $Al_2O_3$, $SiO_2$, AlN, and $HfO_2$. The sacrificial dielectric layer 510 may be formed using one or more of low pressure chemical vapor deposition (LPCVD), atomic layer deposition (ALD), sputtering, physical vapor deposition (PVD), plasma-enhance chemical vapor deposition (PECVD), MOCVD, MBE, inductively coupled plasma (ICP) deposition, electron-cyclotron resonance (ECR) deposition, or other suitable techniques. In other embodiments, the sacrificial dielectric layer 510 may be formed, in-situ, immediately after and in the same chamber or deposition system (e.g., MOCVD or MBE) as the growth of the semiconductor layers of semiconductor substrate 110. Structure 501 results.

Figure 5A:
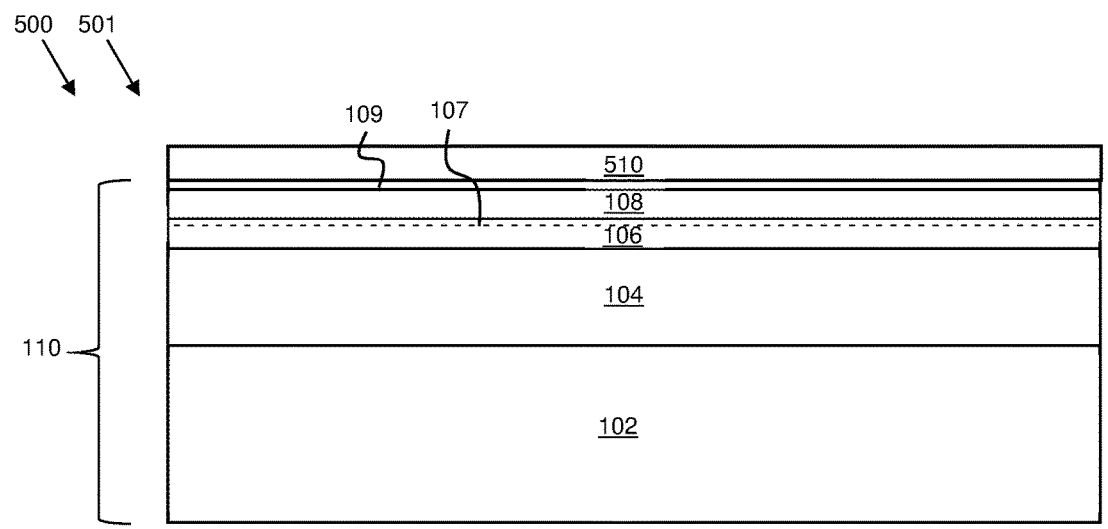
FIGS. 5A, 5B, 5C, and 5D are cross-sectional, side views of fabrication steps for producing a GaN HFET device, in accordance with embodiments of the method of fabrication.
Figure 5B:
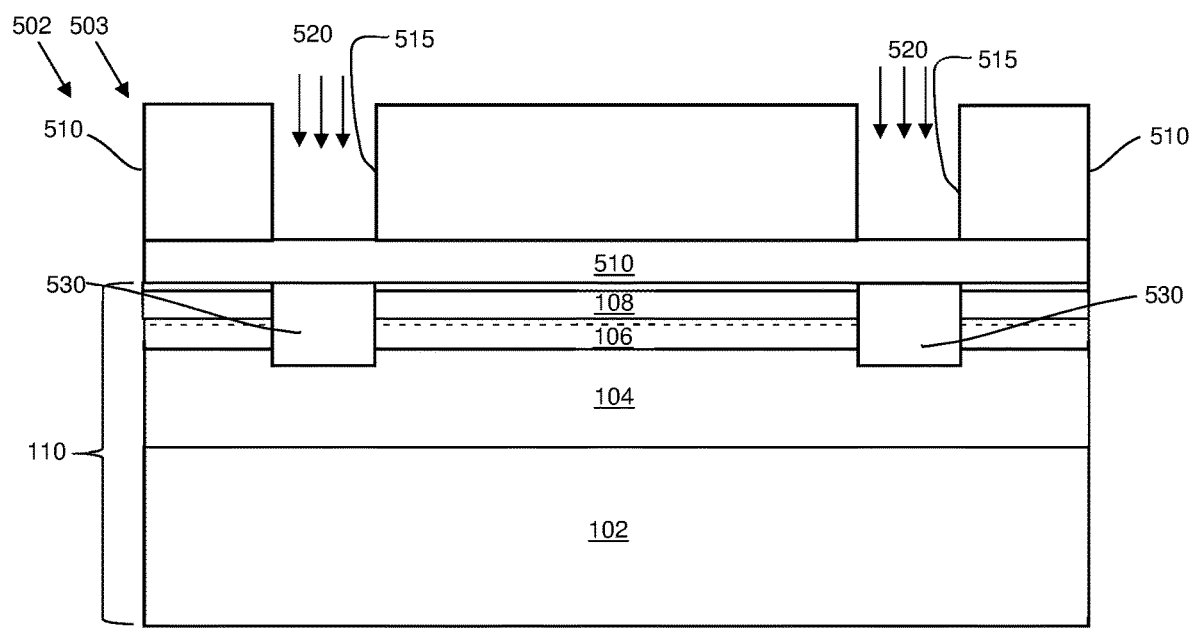

Referring again to block 304 of FIG. 3 and to FIG. 5B and step 502, an embodiment of the method may include patterning an implant mask 512 and implanting a dopant species 520 through an opening 515 in implant mask 512 into the semiconductor substrate to form the implant regions 530 within the semiconductor substrate 110. Once the implant mask 512 is patterned, the dopant species 520 may be implanted through the sacrificial dielectric layer 510 and into the semiconductor substrate 110. In an embodiment, one or more of Si, Ge, O, or other suitable n-type dopant(s) may be implanted into the semiconductor substrate through the implant mask form the implant regions 530. Structure 503 results.

Figure 5C:
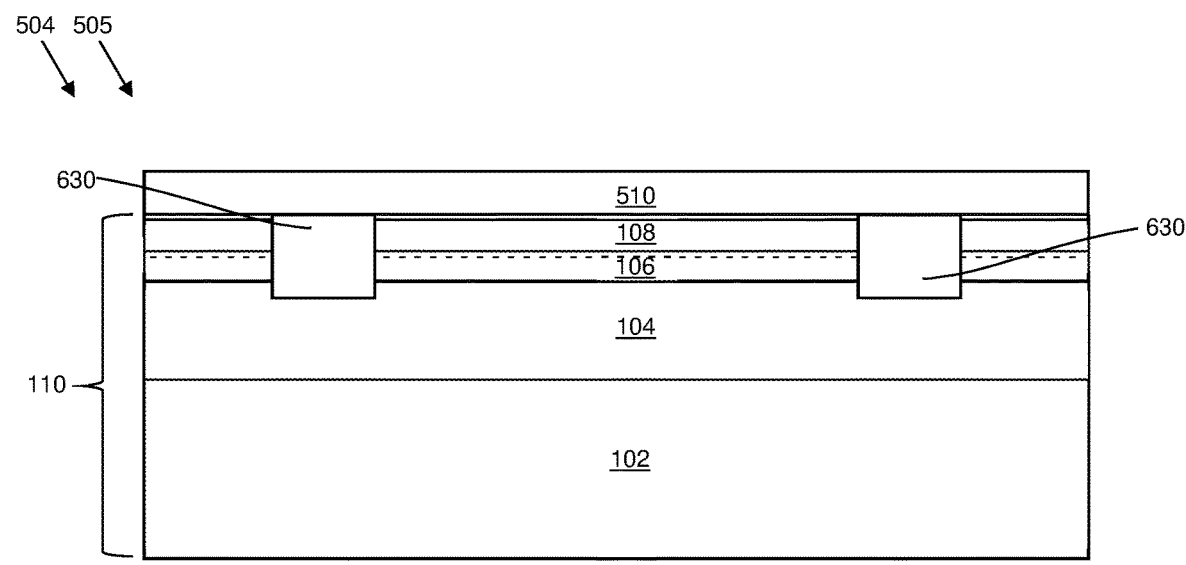

Still referring to block 304 of FIG. 3 and now to FIG. 5C and step 504, an embodiment of the method may include removing the implant mask 512 before activating the dopant species in implant regions 530 to complete the formation of the source and drain regions 142 and 147 within the semiconductor substrate 110. The implant mask 512 may be removed using one or more conventional wet chemical and plasma ashing technique(s). Structure 505 results.

Figure 5D:
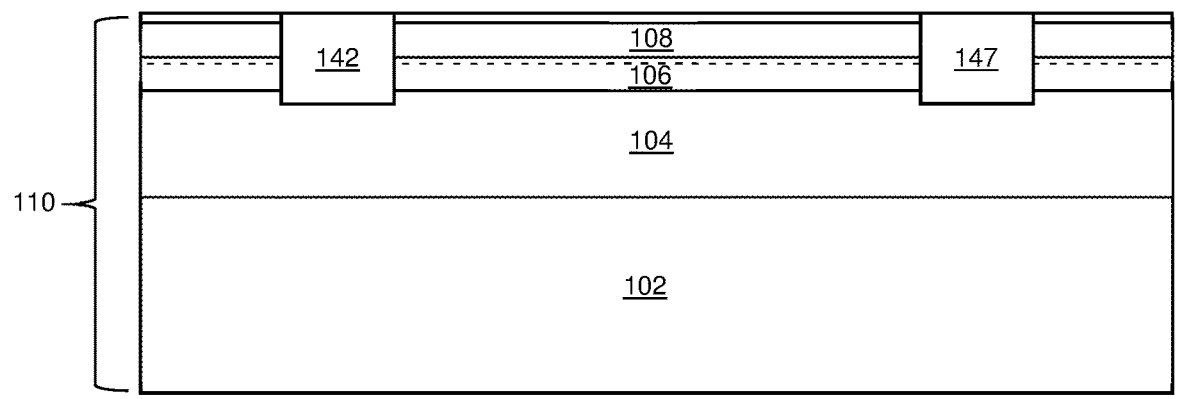

Referring again to block 304 of FIG. 3, and now to FIG. 5D and step 506, an embodiment of the method may include activating the implant regions 530 of structure 505 of FIG. 5C to form the source and drain regions 142, 147 and removing the sacrificial dielectric layer 510. According to an embodiment, the implant regions 530 may be activated by annealing the semiconductor substrate 110 using an activation anneal at a temperature of between about 900° C. and about 1,500° C. In some embodiments, the duration of the activation anneal may be between about 60 seconds and about 600 seconds. In other embodiments, the duration of the activation anneal may be between about 10 seconds and about 2,000 seconds. After activating the implant regions 530 to create source and drain regions 142, 147, the sacrificial dielectric layer 510 may be removed using wet and or dry etching. Structure 507 results.

Figure 6:
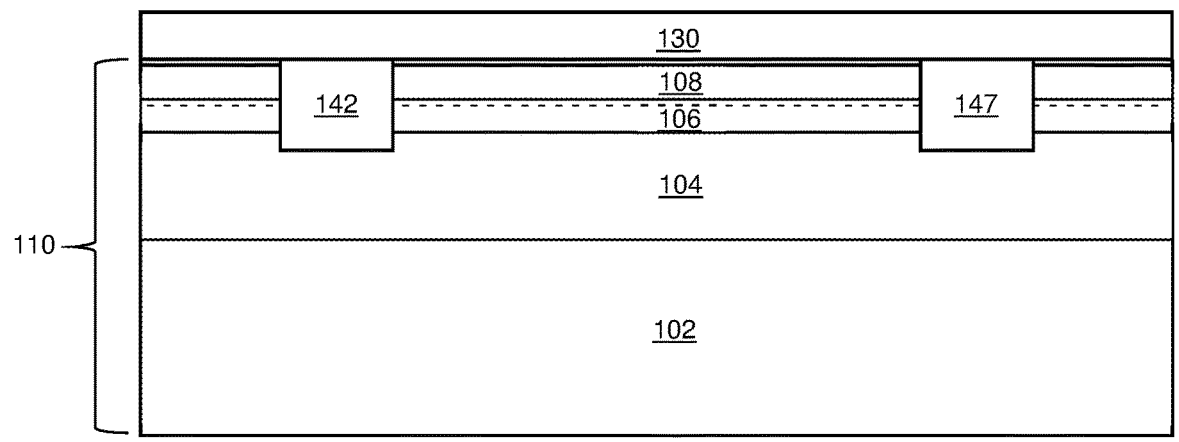
FIG. 6 is a cross-sectional, side view of a fabrication step for producing a GaN HFET device, in accordance with embodiments of the method of fabrication.

Referring now to block 306 of FIG. 3, now to FIG. 6 and step 600, an embodiment of the method may include forming the first dielectric layer 130 on or over the semiconductor substrate 110 of the structure 507 of FIG. 5D. In other embodiments of the method that do not include implanted ohmic contacts (not shown), the first dielectric layer 130 may be formed the semiconductor substrate 110 is formed in block 302 of FIG. 3 and step 400 of FIG. 4. As discussed previously, in an embodiment, the first dielectric layer 130 may include materials selected from SiN, $Al_2O_3$, $SiO_2$, AlN, and $HfO_2$. The first dielectric layer 130 may be formed using one or more of LPCVD, ALD, sputtering, PVD, PECVD, MOCVD, MBE, ICP deposition, ECR deposition, or other suitable techniques. Structure 601 results.

Figure 7A:
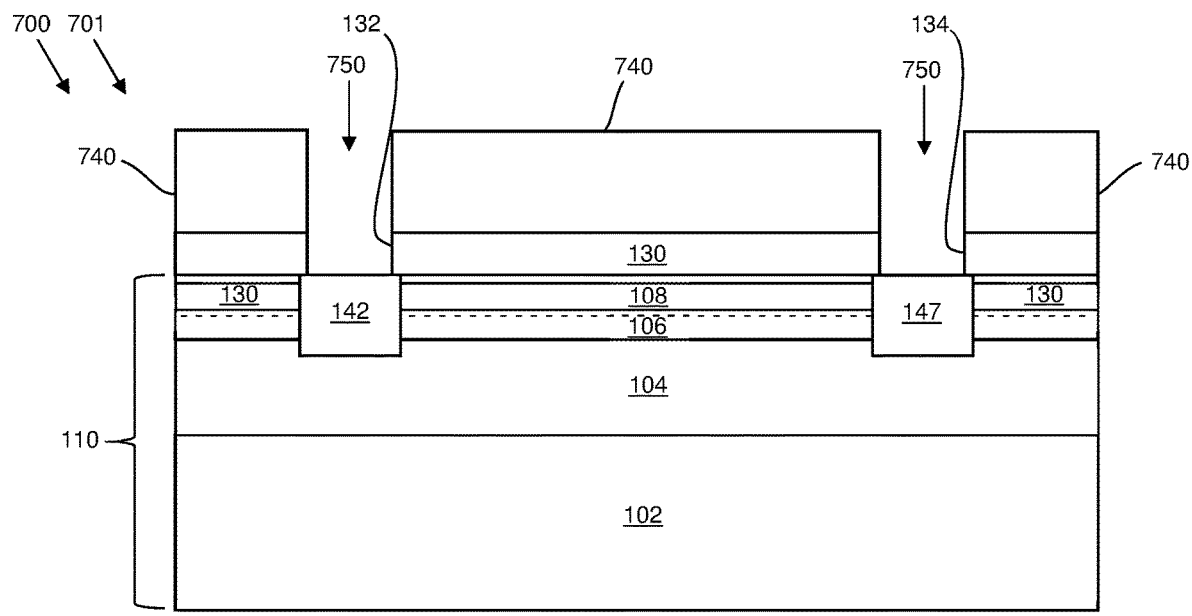
FIGS. 7A, 7B, and 7C are cross-sectional, side views of fabrication steps for producing a GaN HFET device, in accordance with embodiments of the method of fabrication.
Figure 7B:
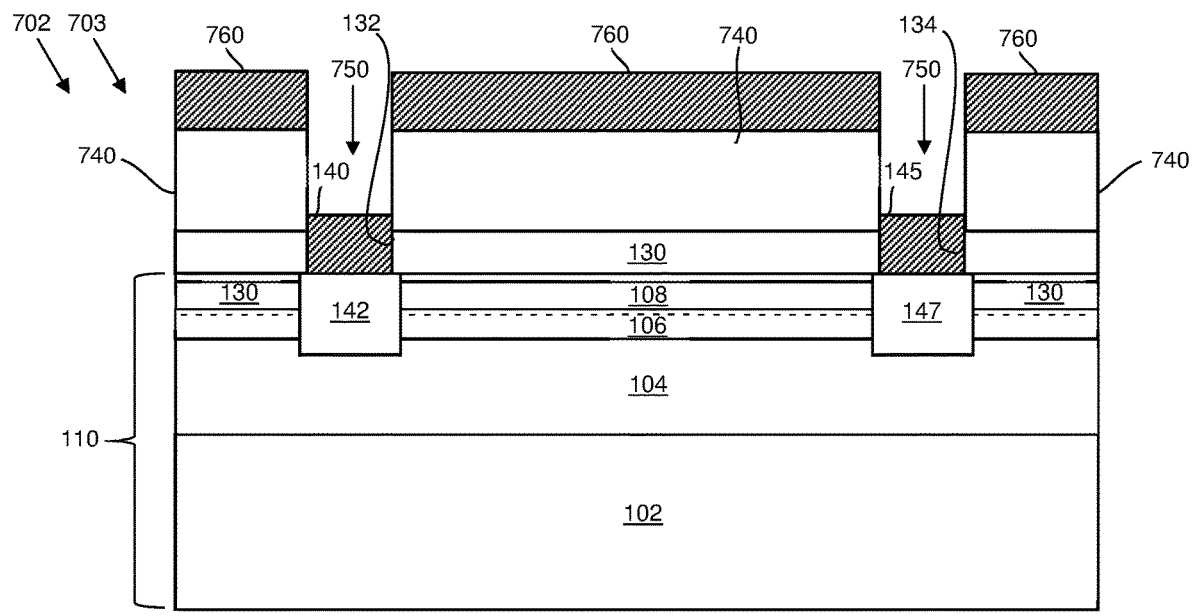
Figure 7C:
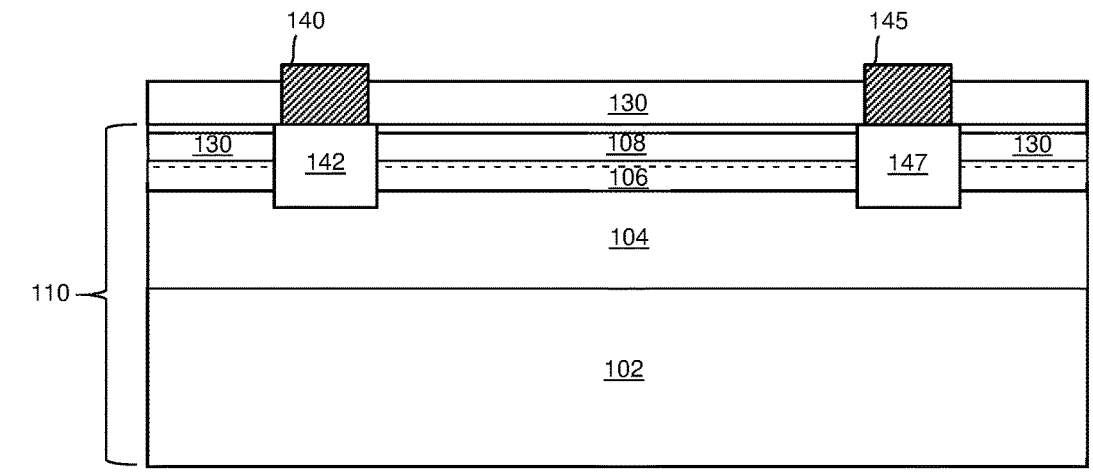

Referring now to block 308 of FIG. 3, and as depicted in steps 700, 702, and 704 of FIGS. 7A, 7B, and 7C, an embodiment of the method may include forming source and drain electrodes 140 and 145. In an embodiment, and referring to FIG. 7A, forming the source and drain openings 132, 134 and may include dispensing a resist layer 740 over the first dielectric layer 130 and patterning the resist layer 740 to form resist openings 750. In an embodiment, source and drain electrodes 140 and 145 may be created by etching through the first dielectric layer 130 in areas exposed by the resist openings 750 to form source and drain openings 132 and 134. Etching the first dielectric layer 130 (e.g., SiN) may include etching using one or more dry and/or wet etch technique(s) such as reactive ion etching (RIE), ICP etching, ECR etching, and wet chemical etching according to an embodiment. Suitable wet-etch chemistries may include hydrofluoric acid (HF), buffered HF, buffered oxide etch (BOE), phosphoric acid ($H_3PO_4$), or other suitable wet etchant(s), according to an embodiment. These dry etching techniques may use one or more of sulphur hexafluoride ($SF_6$), di-carbon hexafluoride ($C_2F_6$), carbon tetrafluoride ($CF_4$), tri-fluoromethane ($CHF_3$) or other suitable chemistry, to remove SiN, according to an embodiment. In an embodiment, the etchant used to etch the first dielectric 130 may selectively etch a portion of the first dielectric layer 130 and then stop on an etch stop layer (not shown, e.g., $Al_2O_3$ or AlN) formed between the first dielectric layer 130 and the semiconductor substrate 110. In an embodiment, etching the etch stop layer (e.g., an $Al_2O_3$ or AlN etch stop layer) may include wet and/or dry etch techniques. In other embodiment(s), dry etching of the etch stop layer (e.g., an AlN or $Al_2O_3$ etch stop) may include dry etching using suitable techniques (e.g., RIE, ICP, or ECR) in conjunction chlorine-based chemistry such as $Cl_2$, boron trichloride ($BCl_3$), or other suitable dry-etch chemistries. Structure 701 results.

Referring now to block 306 of FIG. 3, and step 702 of FIG. 7B, an embodiment of the method may include forming the source and drain electrodes 140 and 145 in the source and drain openings 132 and 134 over the first dielectric layer 130. In an embodiment, the method may include depositing ohmic contact metal 760 over the resist layer 740 and into the source and drain openings 132 and 134. In an embodiment, the ohmic contact metal 760 may contain one or more conductive layers that include Ti, Ta, Al, Mo, Au, Ni, Si, Ge, platinum (Pt), tungsten (W), and or other refractory metals, that when annealed, may form an ohmic contact with the source and drain regions 142, 147. In an embodiment, the ohmic contact metal 760 may include a stack deposited on the substrate that includes Ti, Al, and Au. In an embodiment, to form the ohmic contact metal 760, a Ti layer may be disposed over the semiconductor substrate 110 in the openings 132, 134, an Al layer may be disposed over the Ti layer, a barrier layer formed from Mo or other suitable barrier metal such as Ni or tungsten, may be disposed over the Al layer, and an Au layer may be disposed over the barrier layer. In an embodiment, the ohmic contact metal 760 may be deposited by evaporation. In other embodiments, the ohmic contact metal 760 may be deposited by sputtering, PVD, or other suitable deposition techniques. In an embodiment, the Ti layer may be between about 100 angstroms and 200 angstroms thick, the Al layer may be between about 600 angstroms and 1500 angstroms thick, the Mo layer may be between about 200 angstroms and 700 angstroms thick, and the Au layer may be between about 300 angstroms and 1,000 angstroms thick. In other embodiments, other metals may be substituted (e.g., Ni or Pt may be substituted for Mo or Ta may be used in addition to Ti, above or below Ti, to or substituted for Ti) and other thicknesses may be used. In an embodiment, the resist layer 740 may be configured in a lift-off profile, wherein the openings of the resist layer 740 have a retrograde profile, allowing the metal not deposited into resist openings 750 to "lift off" when dissolved in solvents. In other embodiments, the source and drain electrodes 140 and 145 may be patterned by dry etching (not shown). Structure 703 results.

Referring again to block 306 of FIG. 3, and as depicted in step 704 of FIG. 7C, an embodiment of the method may include annealing source and drain electrodes 140 and 145. In an embodiment, annealing the source and drain electrodes 140, 145 may include an annealing step used to alloy the ohmic contact metal 760 of FIG. 7B, resulting in ohmic contacts to the source and drain regions 142 and 147 formed in semiconductor substrate 110 that form source and drain electrodes 140 and 145. In an embodiment, the annealing step may be accomplished by rapid thermal annealing. In an embodiment, the ohmic metal 760 of FIG. 7B that remains in source and drain openings 132 and 134 of FIG. 7B may be alloyed at a temperature of between about 400 degrees Celsius and about 700 degrees Celsius for between about 15 seconds and about 60 seconds. In other embodiments the ohmic metal 760 of FIG. 7B may be annealed at between about 300 degrees Celsius and about 800 degrees Celsius for between about 10 seconds and about 600 seconds, though other higher or lower temperatures and times may be used. In an embodiment, the metal stack used to form the ohmic metal 760 (e.g., Ti, Al, Mo, and Au) may form the source and drain electrodes 140 and 145. Structure 705 results.

Without departing from the scope of the inventive subject matter, source and drain electrodes 140, 145 may be formed using alloyed ohmic contacts (not shown). In these embodiments, source and drain regions may not be formed. Rather, ohmic contact to semiconductor substrate 110 is accomplished by high temperature annealing of the ohmic metals (e.g., Ti, Al, Mo, Au may be used to form an ohmic contact to the channel 107, as described above).

Figure 8:
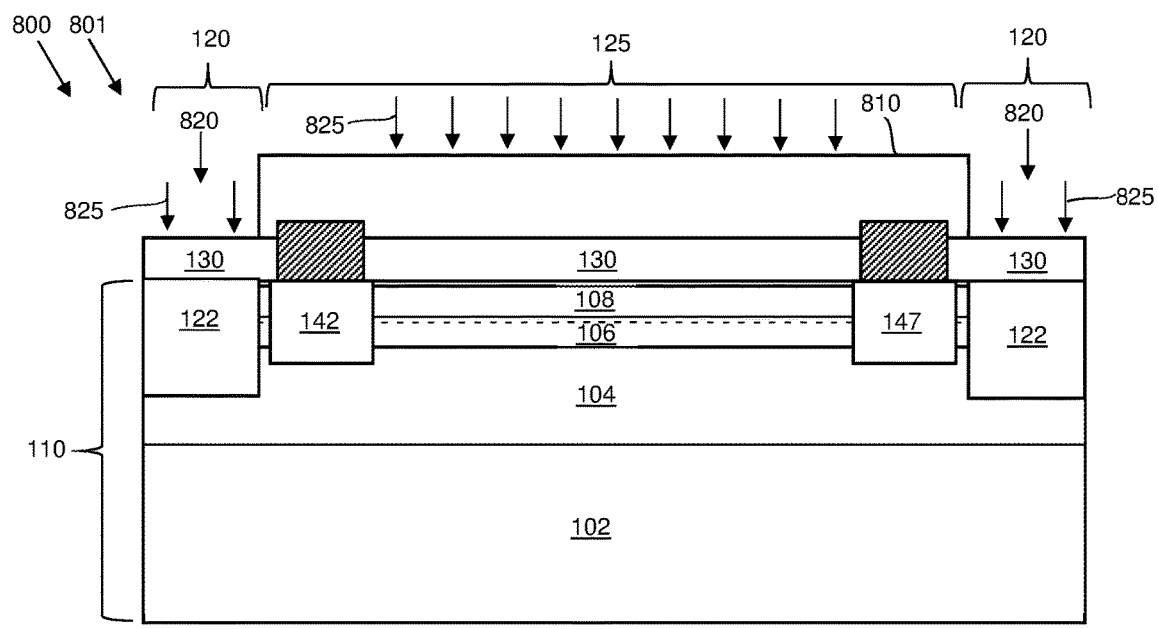
FIG. 8 is a cross-sectional, side view of a fabrication step for producing a GaN HFET device, in accordance with embodiments of the method of fabrication.

Referring now to block 308 and step 800 of FIG. 8, in an embodiment, the method may include creating isolation regions 120. Forming the isolation regions 120 may include dispensing and patterning a resist mask 810 over the first dielectric layer 130 and then defining openings 820 in the resist mask 810. Using ion implantation, a dopant species 825 (e.g., one or more of oxygen, nitrogen, boron, arsenic, and helium) may be driven into the semiconductor substrate 110 to create high resistivity regions 122. In an embodiment, the energy and dose of the implant may be configured to create a sufficient amount of damage in the crystal structure of the semiconductor substrate 110 such that the semiconductor substrate is substantially high resistivity or semi-insulating within the high resistivity regions 122 of the isolation regions 120. In other embodiments (not shown), forming the isolation regions 120 may include, first, etching some or all of the semiconductor layers in the semiconductor substrate 110 and then ion implanting to enhance the resistivity in the remaining semiconductor layers and/or the host substrate 102. In some embodiments, the isolation regions 120 may be formed after forming the source and drain electrodes 140, 145. In other embodiments, the isolation regions 120 may be formed before forming the source and drain electrodes 140, 145. Structure 801 results.

Figure 9A:
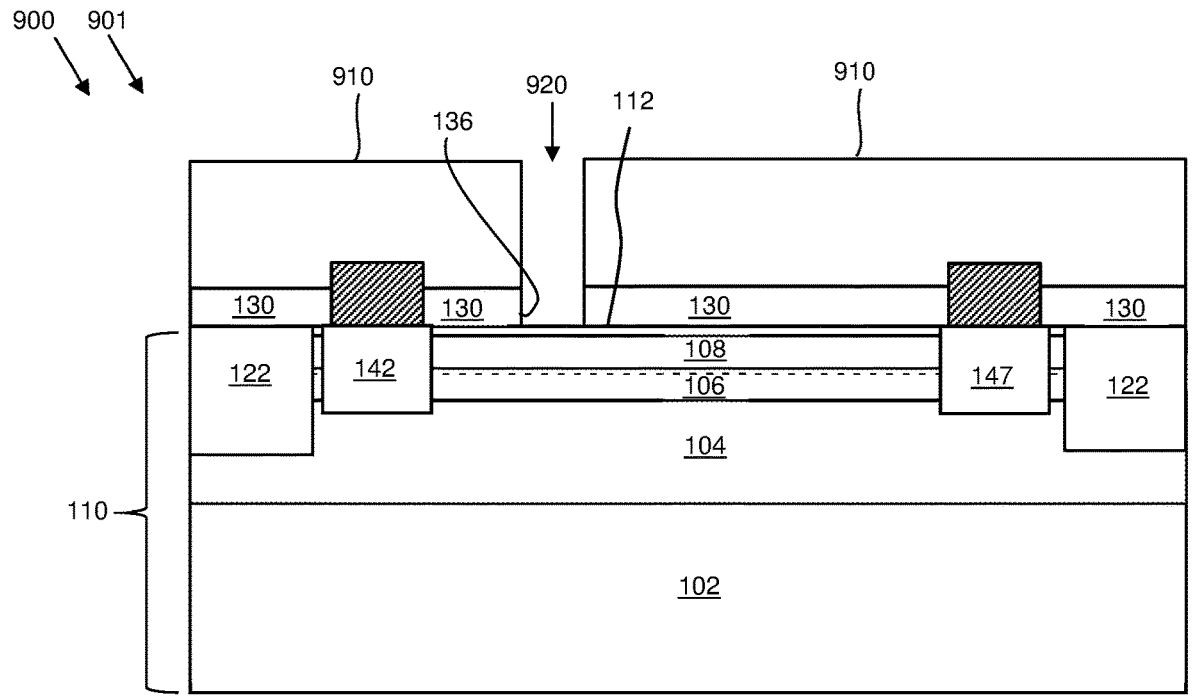
FIGS. 9A and 9B are cross-sectional, side views of fabrication steps for producing a GaN HFET device, in accordance with embodiments of the method of fabrication.
Figure 9B:
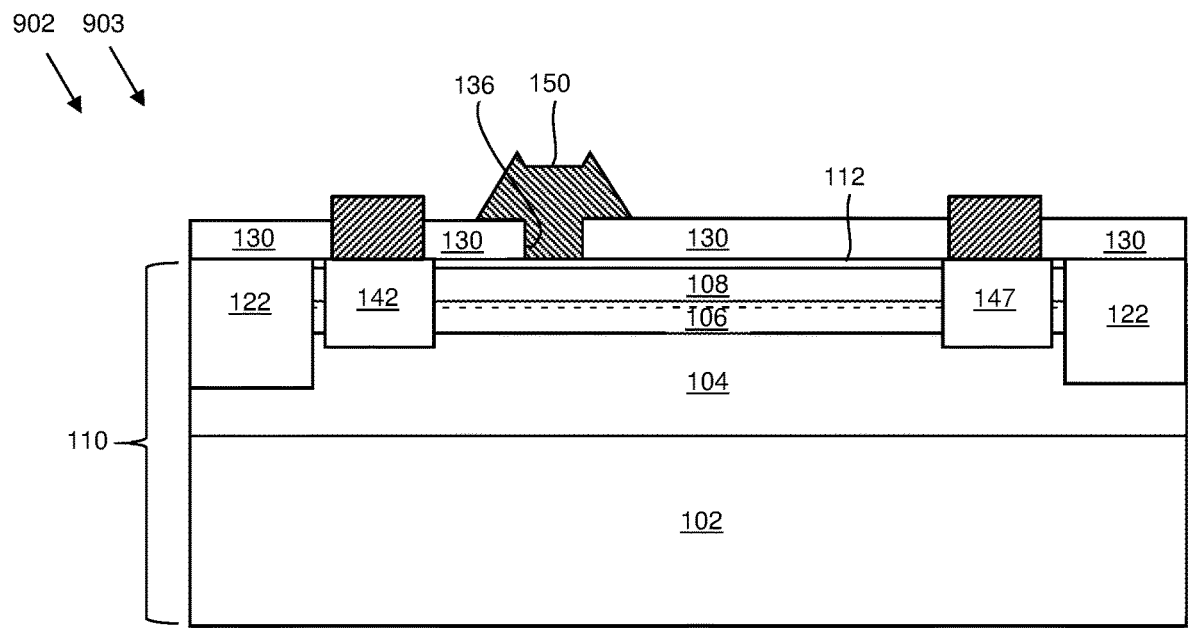

Referring next to block 310 of FIG. 3 and steps 900, 902 of FIGS. 9A and 9B, in an embodiment, forming the gate electrode 150 of the GaN HFET devices 100, 200 of FIGS. 1 and 2 may include forming the gate opening 136 in the first dielectric layer 130 and forming the gate electrode 150 within the gate opening 136. In an embodiment, forming the gate electrode 150 may include depositing and patterning a conductive material to form the gate electrode 150.

Referring now to FIG. 9 and step 900, in an embodiment of the method, a resist layer 910 (e.g., photo resist or e-beam resist) may be patterned to create an opening 920 in the resist layer 910. Using the opening created in the resist layer 910, the first dielectric layer 130 may be etched dry and/or wet chemical etch(s) analogous to that described in connection with FIG. 7A, step 700, to form the gate opening 136, thus exposing a portion of the upper substrate surface 112, according to an embodiment. Structure 901 results. The resist layer 910 may then be removed using wet stripping and/or plasma ashing, according to an embodiment (not shown).

Referring now to FIG. 9B and step 902, in an embodiment, one or more layers of gate metal may then be deposited and patterned to form the gate electrode 150 over the upper substrate surface 112 of the semiconductor substrate 110 over the first dielectric layer 130 and within the gate opening 136, using, e.g., the lift-off resist technique, analogous to the description given for FIG. 8B and step 802. Depositing gate metal to form the gate electrode 150 may include depositing a multi-layer stack that includes one or more metal layers and/or other suitable materials. A first layer within the multi-stack used to form the gate electrode 150 may include Ti, Ni, Pt, Cu, palladium (Pd), Cr, W, Iridium (Ir), poly-silicon or other suitable materials. The first layer may be between about 30 and about 2,000 angstroms in thickness, although other thickness values may be used. One or more layers that act as conductive layers may be deposited over the first layer to form the gate electrode 150, according to an embodiment. The conductive layer(s) may include Au, Ag, Al, Cu, Ti or other substantially conductive materials. The conductive layer(s) may be between about 50 and about 20,000 angstroms in thickness, although other thickness values may be used. Optionally, one or more barrier metal layers may be placed between the first layer and the conductive layer(s), where the barrier metal layer(s) may include materials such as Ni, Pt, Cu, Pd, Cr, W, Ir or other substantially refractive materials that act as a barrier between the portion of the first layer that contacts the semiconductor substrate 110 and first dielectric layer 130 and the conductive layer(s). The barrier metal layer(s) may be between about 50 and about 10,000 angstroms in thickness, although other thickness values may be used. In an embodiment, the various layers used to form gate electrode 150 may be deposited by evaporation, sputtering, PVD, ALD, or other suitable deposition technique(s). Structure 903 results.

It should be appreciated that other methods may be used to form the gate electrode 150 without departing from the scope of the inventive subject matter. In other embodiments, gate metal may be disposed over a gate dielectric such as SiO2, HfO2, Al2O3, or similar materials (not shown). The gate dielectric may be deposited over and above the upper substrate surface 112, according to an embodiment. In still other embodiments, the gate electrode 150 may be formed using gate metal that is deposited over the semiconductor substrate 110 and is then defined by patterning photo resist, and then etching the gate metal (not shown). In whichever embodiment or method is selected to form gate electrode 150, gate metal may then be deposited using the methods described in connection with the formation of gate electrode 150 shown in FIG. 9B.

Figure 10:
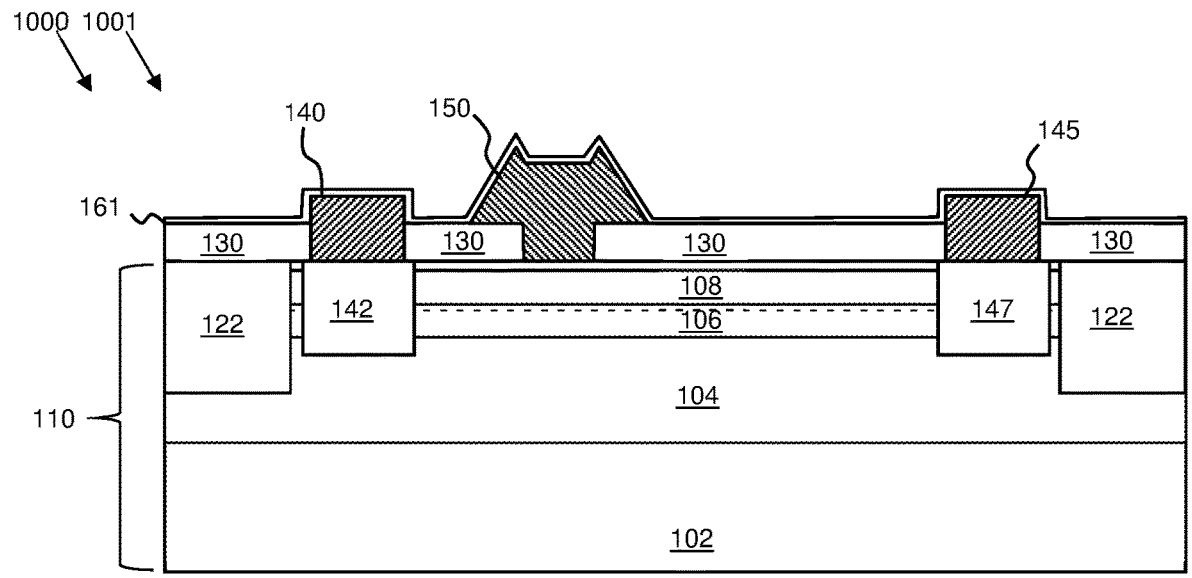
FIG. 10 is a cross-sectional, side view of a fabrication step for producing a GaN HFET device, in accordance with embodiments of the method of fabrication.

Referring now to block 312 of FIG. 3 and FIG. 10 and step 1000 an embodiment of the method may include forming the first etch stop layer 161 of the GaN HFET's 100, 200 of FIGS. 1 and 2. According to an embodiment of the method, the etch stop layer 161 may be formed over the first dielectric layer 130, the source electrode 140, the drain electrode 145, and the gate electrode 150. In an embodiment, the etch stop layer 161 may include one of SiN, $Al_2O_3$, $SiO_2$, $HfO_2$, ITO, diamond, poly-diamond, AlN, BN, SiC, or a combination of these or other insulating materials. The etch stop layer 161 may be configured to block an etchant of the spacer portions 162, 164, according to an embodiment. The total thickness of the layers used to form the etch stop layer 161 may be between about 50 and about 1,000 angstroms in thickness, although other thickness values may be used. The second etch stop layer 161 may be deposited using LPCVD, PECVD, sputtering, PVD, ALD, Cat-CVD, HWCVD, ECR CVD, CVD, ICP-CVD, a combination of these or other suitable dielectric deposition technique(s). Structure 1001 results.

Figure 11A:
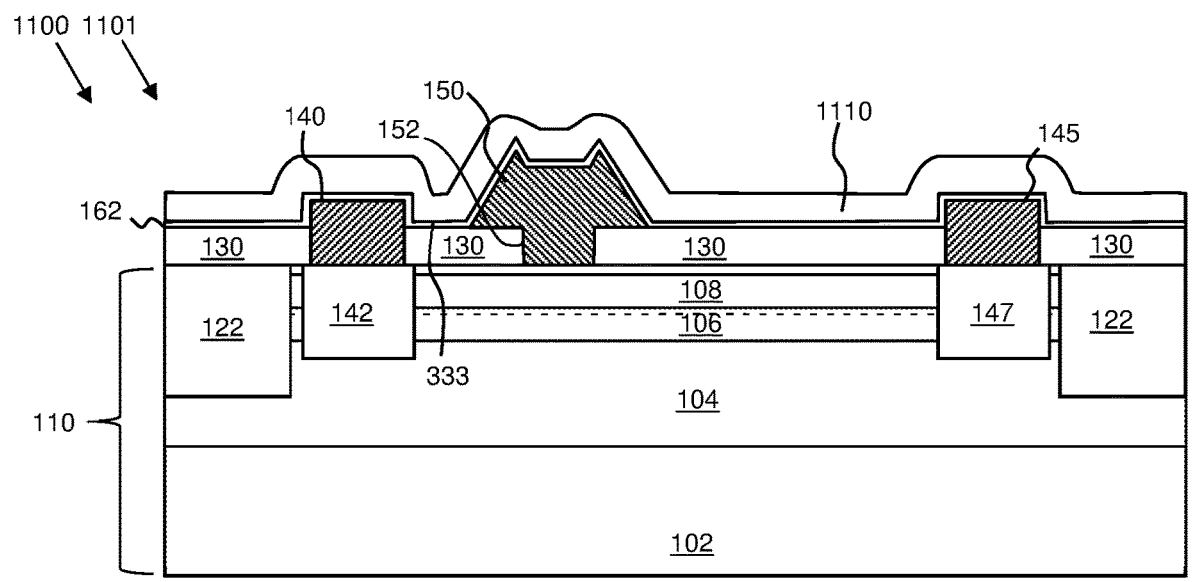
FIGS. 11A, 11B, and 11C are cross-sectional, side views of fabrication steps for producing a GaN HFET device, in accordance with embodiments of the method of fabrication.
Figure 11B:
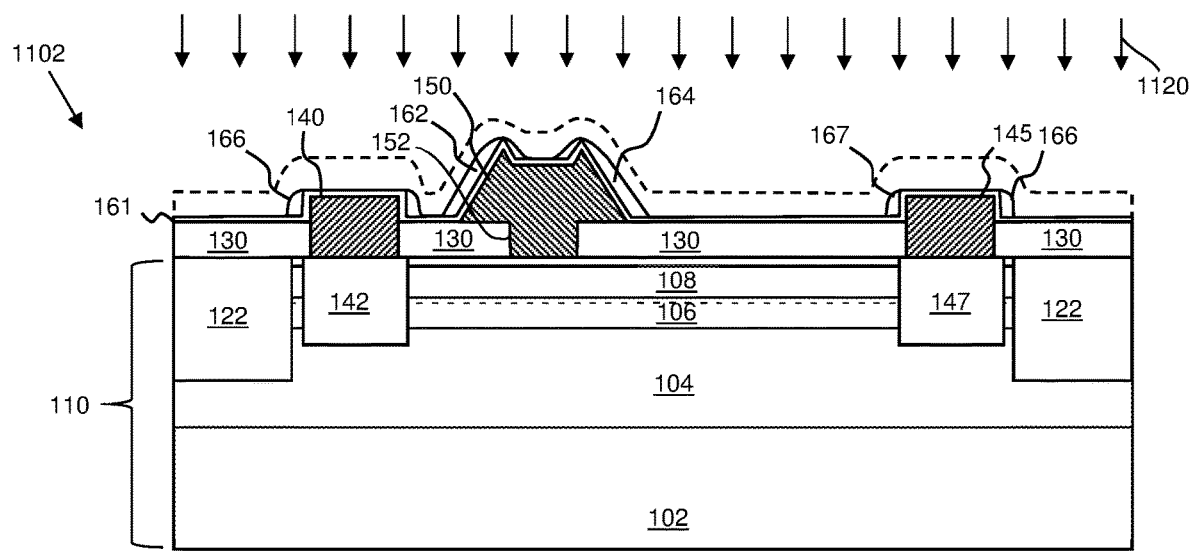
Figure 11C:
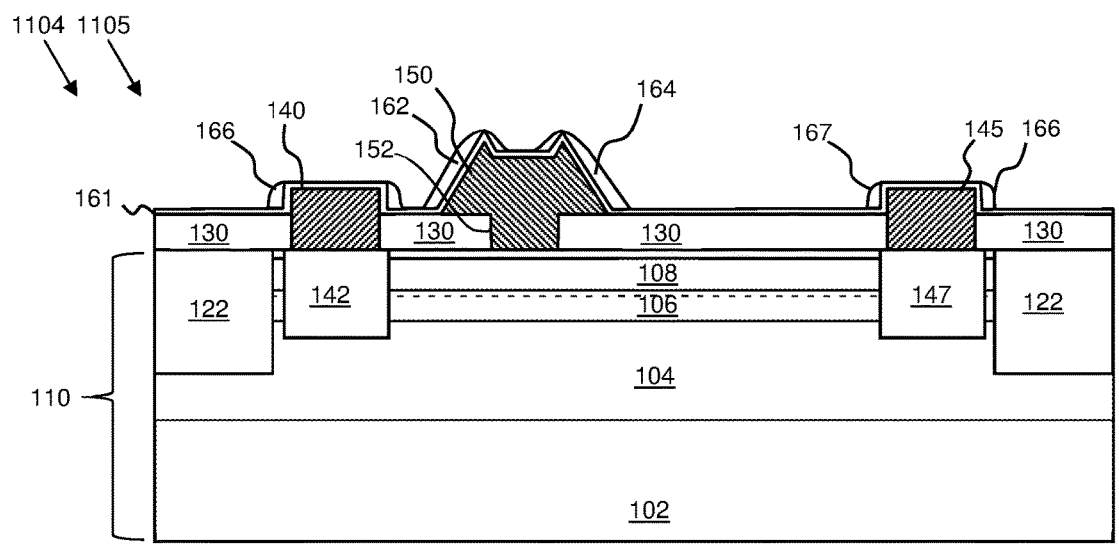

Referring now to block 314 of FIG. 3 and to FIGS. 11A, 11B, and 11C and steps 1100, 1102, and 1106, an embodiment of the method may include forming the spacer portions 162, 164 of FIG. 1. In an embodiment, and as shown in FIG. 11A, forming the spacer portions 162, 164 may include conformally depositing a blanket dielectric layer 1110 over the first etch stop layer 161 and over the gate electrode 150. Structure 1101 results. In an embodiment of the method, and as shown in FIG. 11B, depositing the blanket dielectric layer 1110 may be followed by step 1102 of anisotropically etching the blanket dielectric layer 1110 of structure 1101. As depicted in FIG. 11B, the anisotropic etching of the blanket dielectric layer 1110 may be accomplished by using a dry etch 1120 to form the spacer portions 162, 164, according to an embodiment. Anisotropically etching the blanket dielectric layer 1110 may include etching using one or more dry etch techniques such as RIE, ICP etching, ECR etching, according to an embodiment. These dry etching techniques may use one or more of $SF_6$, $C_2F_6$, $CF_4$, $CHF_3$ or other suitable chemistry, to anisotropically etch the blanket dielectric layer 1110. In an embodiment, additional spacers 166 may form adjacent source and drain electrodes 140, 145, adjacent other non-planar structures (other non-planar structures not shown). Structure 1105 of FIG. 11C results.

Figure 12:
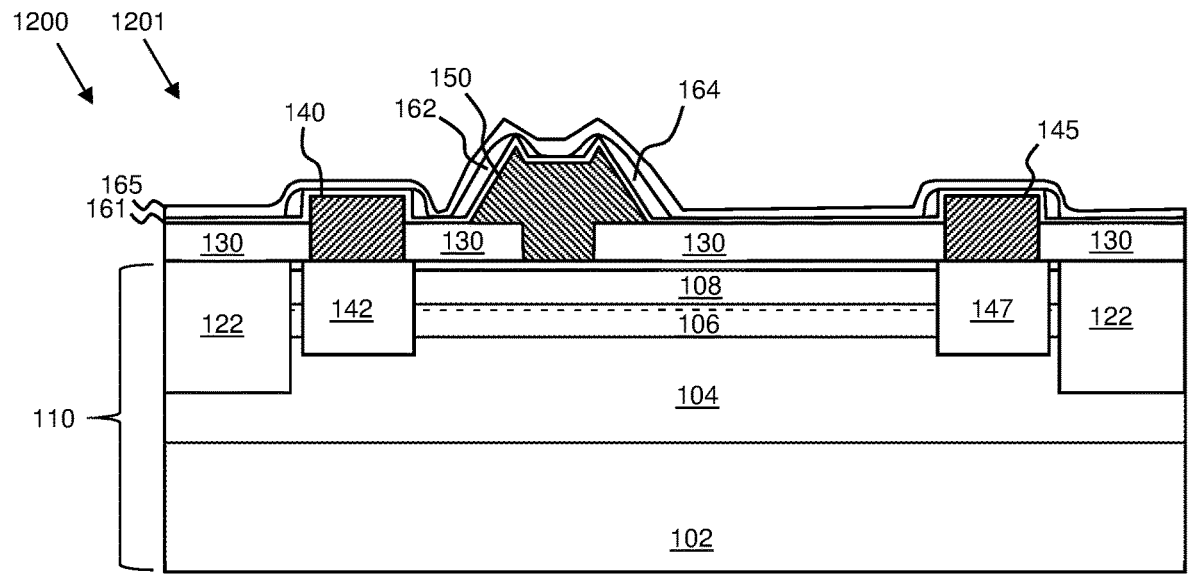
FIG. 12 is a cross-sectional, side view of a fabrication step for producing a GaN HFET device, in accordance with embodiments of the method of fabrication.

Referring now to block 316 of FIG. 3 and FIG. 12 and step 1200, an embodiment of the method may include forming the second etch stop layer 165 of FIG. 1. According to an embodiment of the method, the second etch stop layer 165 may be formed over the first etch stop layer 161, the source electrode 140, the drain electrode 145, and the gate electrode 150. In an embodiment, the second etch stop layer 165 may include one of SiN, $Al_2O_3$, $SiO_2$, $HfO_2$, ITO, diamond, poly-diamond, AlN, BN, SiC, or a combination of these or other insulating materials. The second etch stop layer 165 may be configured to block an etchant of the spacer portions 162, 164, according to an embodiment. The total thickness of the layers used to form the etch stop layer 161 may be between about 50 and about 2,000 angstroms in thickness, although other thickness values may be used. The second etch stop layer 165 may be deposited using LPCVD, PECVD, sputtering, PVD, ALD, Cat-CVD, HWCVD, ECR CVD, CVD, ICP-CVD, a combination of these or other suitable dielectric deposition technique(s). Structure 1201 results.

Figure 13:
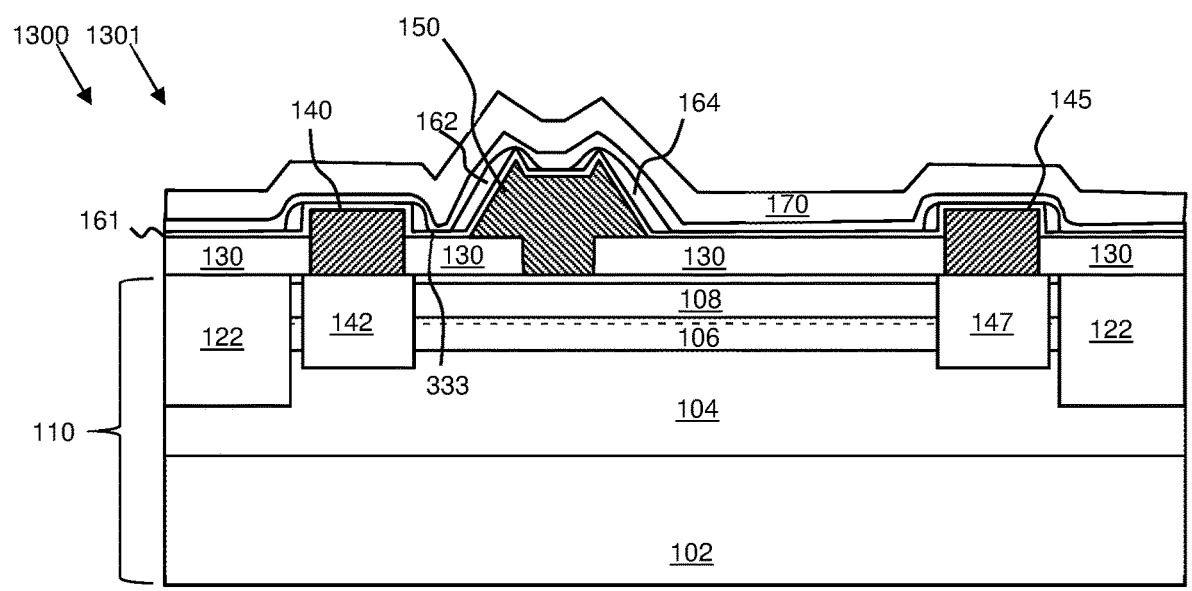
FIG. 13 is a cross-sectional, side view of a fabrication step for producing a GaN HFET device, in accordance with embodiments of the method of fabrication.

Referring now to block 318 of FIG. 3, FIG. 13 and step 1300, the method of fabricating the GaN HFET devices 100, 200 of FIGS. 1-2 may further include depositing and patterning the second dielectric layer 170 over the source and drain electrodes 140,145, the gate electrode 150, the second etch stop layer 165, and the first dielectric layer 130 of structure 1201 of FIG. 12, according to an embodiment. In an embodiment, the second dielectric layer 170 may include one of SiN, Al2O3, SiO2, HfO2, ITO, diamond, polydiamond, AlN, BN, SiC, or a combination of these or other insulating materials. The total thickness of the layers used to form the second dielectric layer 170 may be between about 100 and about 10,000 angstroms in thickness, although other thickness values may be used. The second dielectric layer 170 may be deposited using LPCVD, PECVD, sputtering, PVD, ALD, Cat-CVD, HWCVD, ECR CVD, CVD, ICP-CVD, a combination of these or other suitable dielectric deposition technique(s).

Figure 14A:
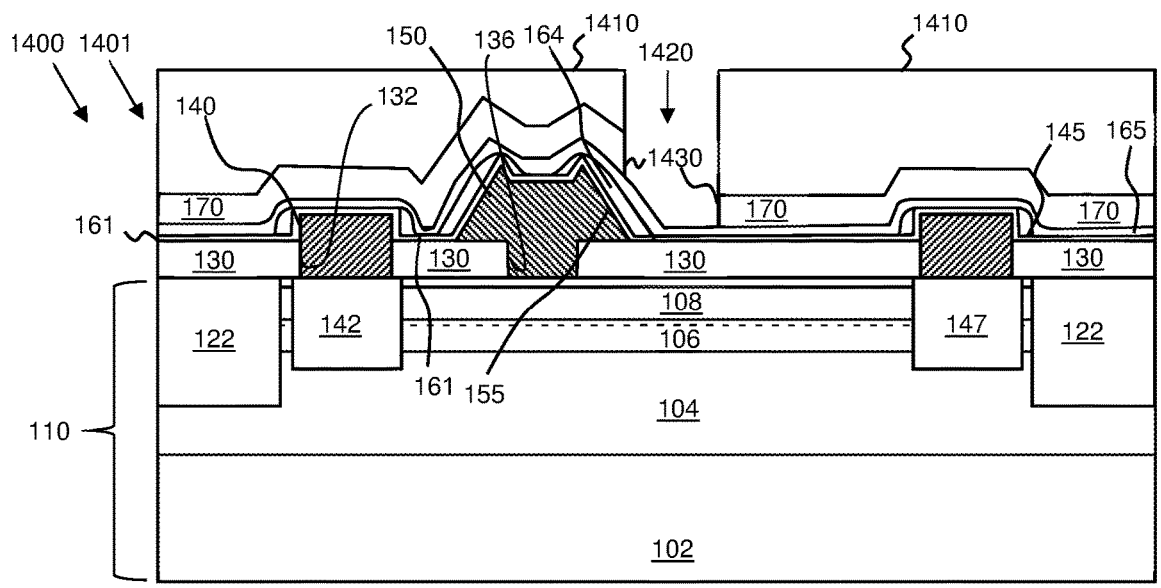
FIGS. 14A and 14B are cross-sectional, side views of fabrication steps for producing a GaN HFET device, in accordance with embodiments of the method of fabrication.
Figure 14B:
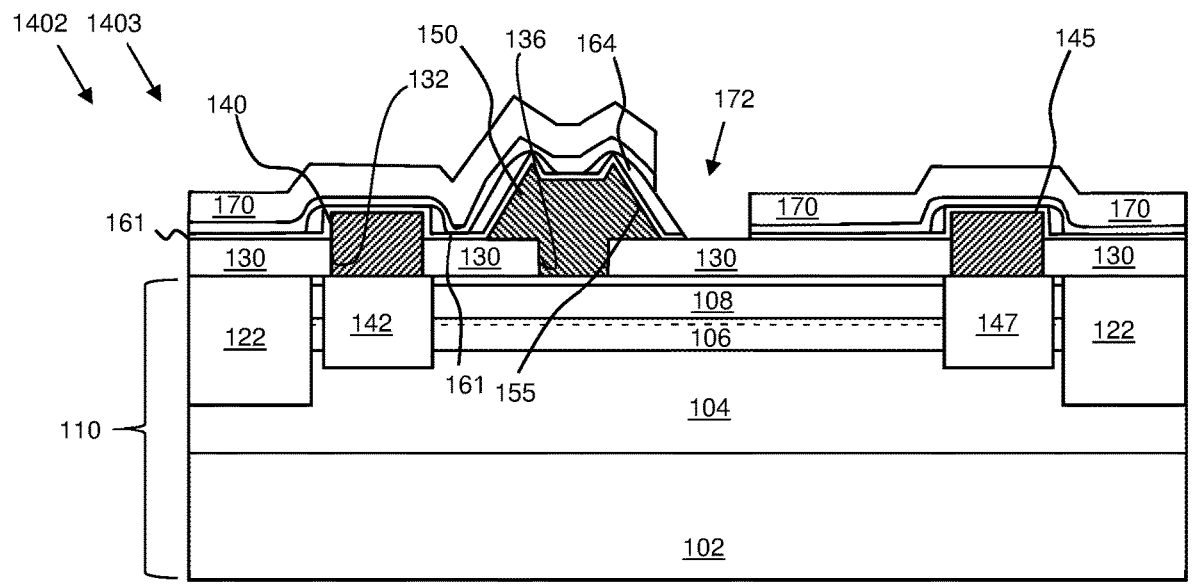

Referring now to block 320 of FIG. 3, FIGS. 14A and 14B, and steps 1400, 1402, the method of fabricating the GaN HFET devices 100 of FIG. 1 may further include creating field plate opening 172 in the second dielectric layer 170, according to an embodiment. Referring specifically to FIG. 14A, and in an embodiment, the steps to etch the second dielectric layer 170 may be analogous to those used to etch the first dielectric layer 130 as described in connection with FIG. 8A, step 800, and may be used to create the field plate opening 172. In an embodiment, the second dielectric layer 170 may be patterned by dispensing a resist layer 1410 over second dielectric layer 170, and patterning the resist layer 1410 to form an opening 1420 to expose a portion of the second dielectric layer 170 along the second sidewall portion 155 of the gate electrode 150 and along the portion of the second dielectric layer 170 parallel to the first dielectric layer 130, adjacent the gate electrode 150, closer to the drain electrode 145. The second dielectric layer 170 may then be etched through the opening 1420 in the resist layer using a technique analogous to the etching of first dielectric layer 130, as described in connection with FIG. 8A, step 800. In an embodiment, the opening 1430 in the second dielectric layer 170 may stop on the second etch stop 165. Structure 1401 results.

Referring now to FIG. 14B, in addition, and according to an embodiment, the second etch stop layer 165 and the first etch stop layer 161 may be etched using a combination of dry and wet chemistry. In an embodiment, the etching of the field plate opening 172 may etch the first and second etch stop layers 161, 165 without damaging the spacer portion 164. In other embodiments (not shown) the first and second etch stop layers may be left in place and not etched beyond their exposure to the etch of the second dielectric layer 170. To accomplish this, and in an example where the second dielectric layer 170 includes a nitride layer (e.g., SiN), the second etch stop layer 165 may be formed from an oxide layer (e.g., Al$_2$O$_3$, SiO2, or TEOS), the first etch stop layer may be formed from a nitride layer (e.g., SiN), and the spacer portion 164 may be formed from an oxide layer (e.g., SiO$_2$ or TEOS), according to an embodiment. In an embodiment, the second dielectric layer 170 (e.g., nitride, SiN) may be etched with chemistry (e.g., F-based) that selectively etches the second dielectric layer 170 (e.g., SiN) without substantially etching the second etch stop layer 165 (e.g., oxide). Thereafter, the underlying first etch stop layer 161 (e.g., SiN) may be etched with a chemistry that does not substantially etch the spacer portion 164. In an embodiment, and after this manner, the field plate opening 172 may be created in the structure 1301 of FIG. 13 and the resist layer 1410 may be removed (not shown). Structure 1403 results.

Figure 15:
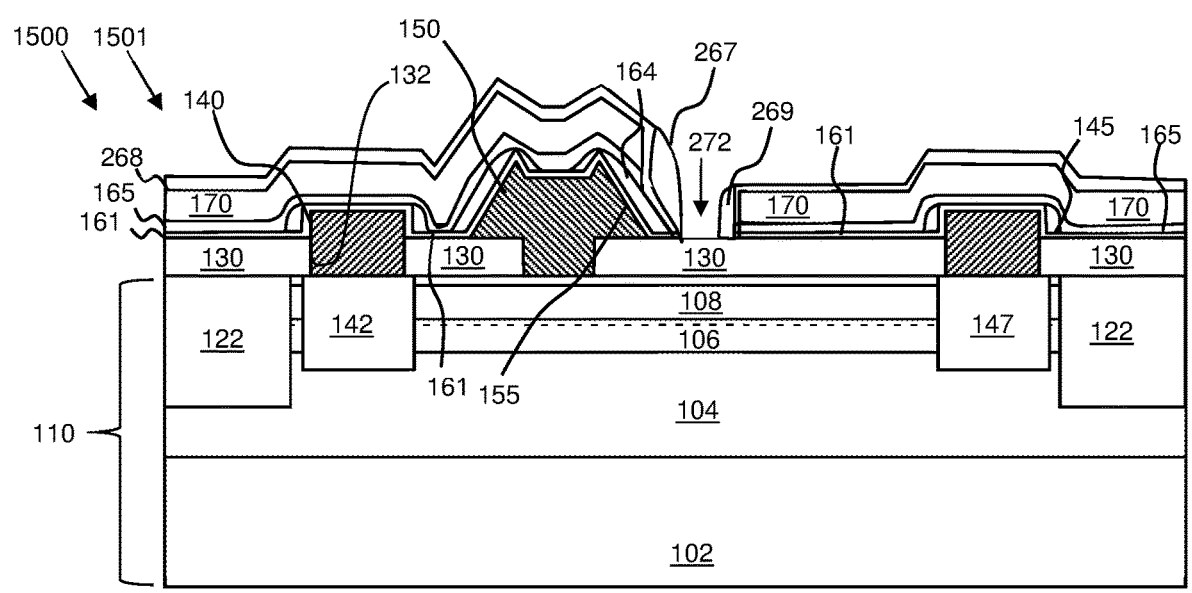
FIG. 15 is a cross-sectional, side view of a fabrication step for producing a GaN HFET device, in accordance with embodiments of the method of fabrication.

Referring now to block 322 of FIG. 3, FIG. 15, and step 1500, the method of fabricating the GaN HFET devices 200 of FIG. 2 may further include forming the third etch stop layer 268 and inside spacers 267, 269 within the field plate opening 272 in the second dielectric layer 170, according to an embodiment. In an embodiment, the third etch stop layer 268 may be formed analogously to the first and second etch stop layers 161, 165. In an embodiment, the third etch stop layer 268 may be formed over the second dielectric layer 170 and within the field plate opening 272. After the deposition of the third etch stop layer 268, the inside spacers 267, 269 may be formed analogously to the spacer portions 162, 164 as in FIGS. 11A, 11B, and 11C, steps 1100, 1102, 1104, i.e., by depositing a blanket dielectric layer (e.g., TEOS, SiO$_2$, or SiN, not shown) over the structure 1401 of FIG. 14, and then anisotropically etching the blanket dielectric layer and stopping the etch on the third etch stop layer 268, leaving behind the inside spacers 267, 269 within the field plate opening 272. Structure 501 results.

Figure 16A:
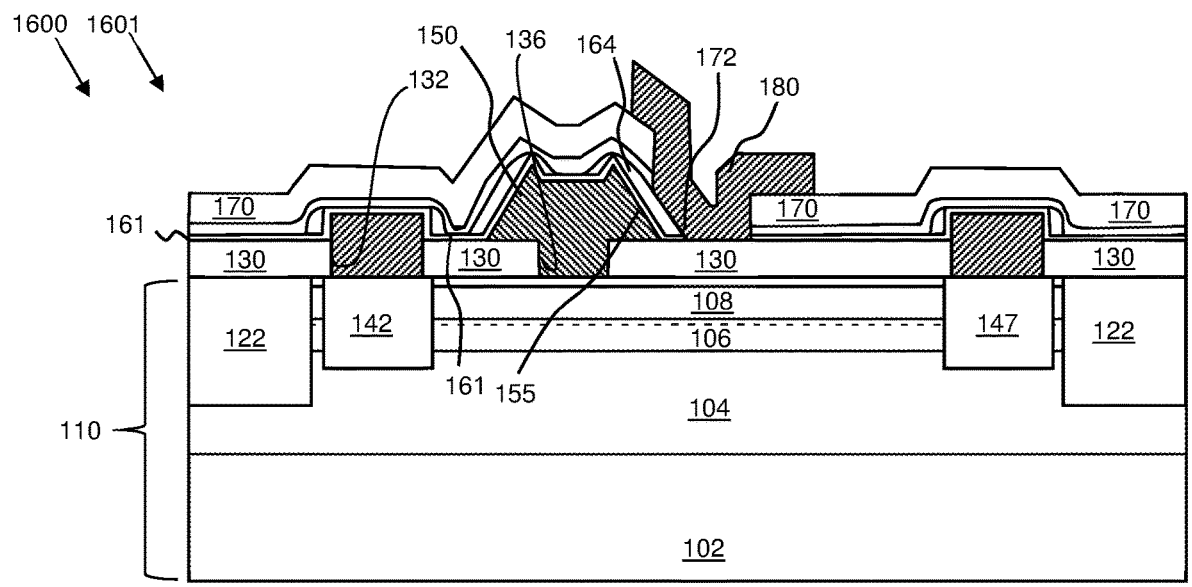
FIGS. 16A and 16B are cross-sectional, side views of fabrication steps for producing a GaN HFET device, in accordance with embodiments of the method of fabrication.
Figure 16B:
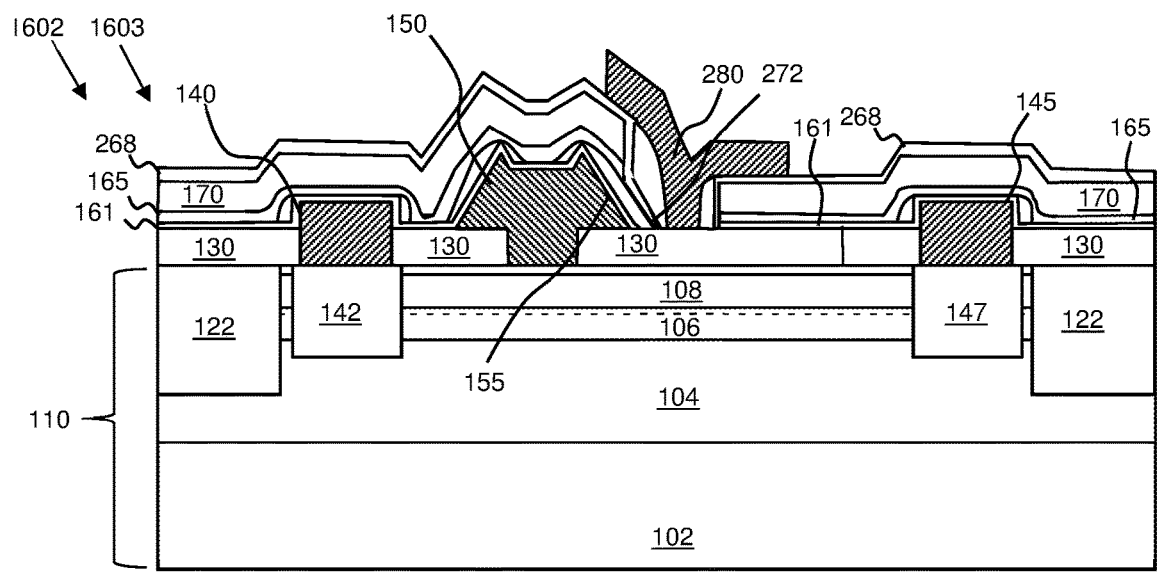

Referring now to block 324 of FIG. 3, FIGS. 16A and 16B, and steps 1600, 1602, the method of fabricating the GaN HFET devices 100, 200 of FIGS. 1-2 may further include depositing and patterning the field plate 180, 280. In an embodiment, forming and patterning the field plate 180, 280 may be accomplished by applying and patterning resist layers (not shown), depositing the field plate 180 into the field plate opening 172, 272, and over the second dielectric layer 272 (or third etch stop layer 268), and removing the resist layers and overlying metal outside the field plate 180, 280, in a lift-off configuration, analogous to step 702 in FIG. 7B. In an embodiment, the second field plate metal may be formed by depositing one or more adhesion and conductive metal layers into openings (not shown) patterned into resist layers applied to the partially-formed device as described above. In an embodiment, the adhesion layer(s) may be deposited first, followed by deposition of the conductive layer(s). In an embodiment, the adhesion and conductive layers may be deposited in the same deposition step. The adhesion layer(s) may include one of Ti, Ni, Cr or other suitable adhesion layer material(s). The adhesion layer(s) may be between about 50 and about 2,000 angstroms in thickness, although other thickness values may be used. The conductive layer(s) may include Cu, Au, Al, or Ag, although other suitable materials may be used. The conductive layer(s) may be between about 200 and about 40,000 angstroms in thickness, although other thickness values may be used. The adhesion and conductive layers used to form the field plate 180, 280 may be deposited over and in contact with the second dielectric layer 170 and the field plate 180, 280 according to an embodiment. In an embodiment, the adhesion layer(s) and conductive layer(s) may be formed by sputtering, evaporation, or electro-plating. In an embodiment, after applying and patterning resist layers and depositing the field plate 180, 280, the resist layers and metals deposited over the resist layers and not included with the portions of the field plate 180 that contact inside the field plate opening 172, 272 and second dielectric layer 170, field plate 180 are removed using solvents analogous to those described in conjunction with step 702 in FIG. 7B. In other embodiments, the field plate 180, 280 may be formed by depositing adhesion and conductive layers that are then patterned by suitable dry or wet chemical etching techniques.

Figure 17A:
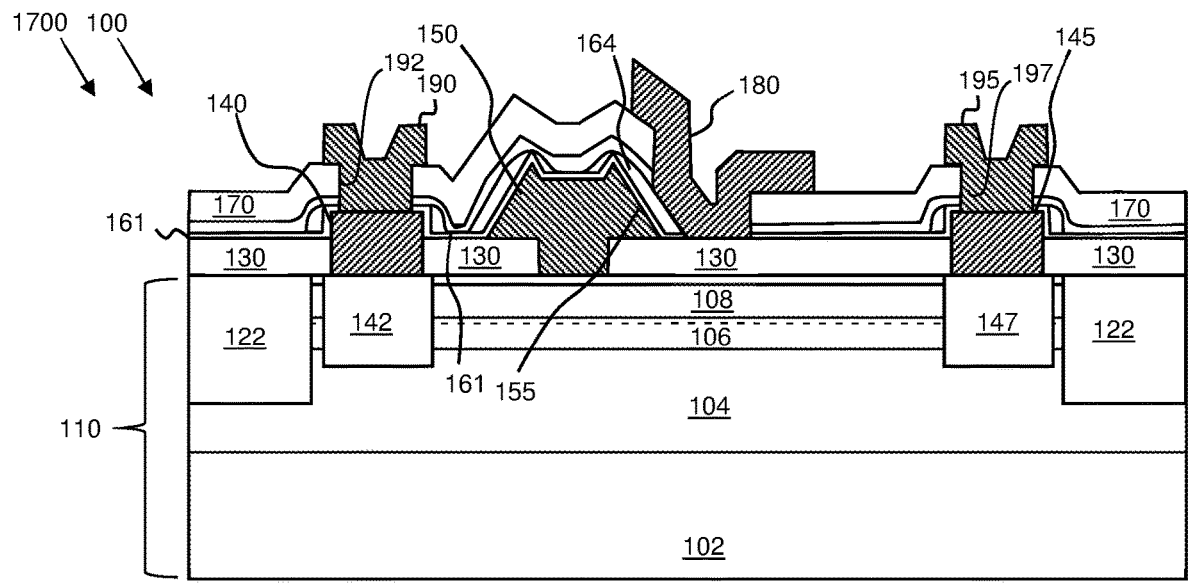
FIGS. 17A, 17B are cross-sectional, side views of fabrication steps for producing a GaN HFET device, in accordance with embodiments of the method of fabrication.
Figure 17B:
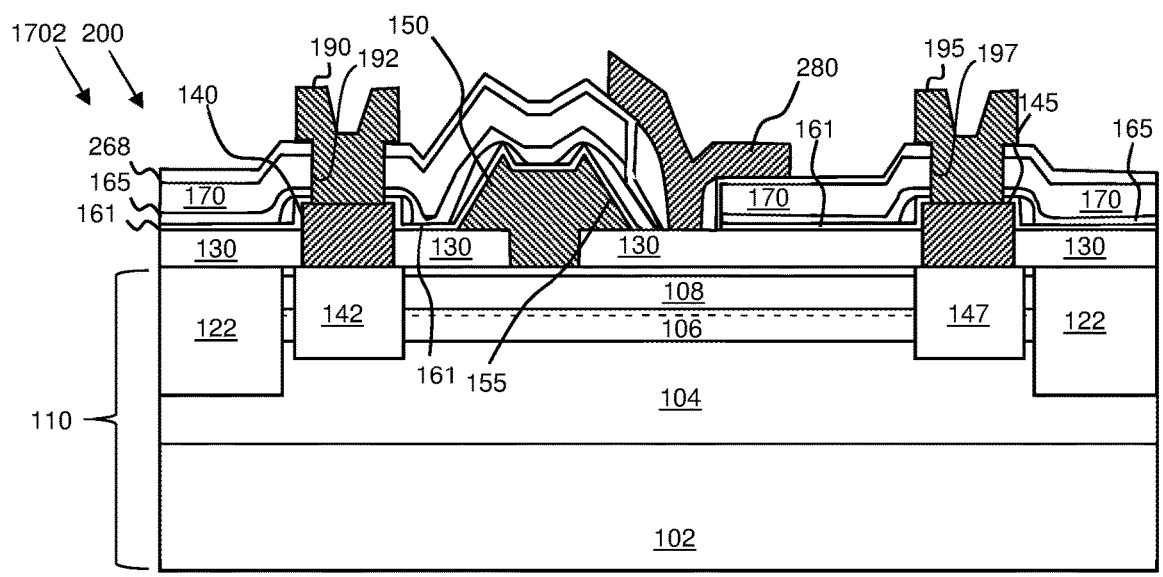

Referring now to block 326 of FIG. 3, FIGS. 17A and 17B, and steps 1700, 1702, the method of fabricating the GaN HFET devices 100, 200 of FIGS. 1-2 may further include completing device processing, including forming the source and drain metallization 190, 195. In an embodiment, completing device processing may include processing additional metallization and dielectric layers. In an embodiment, forming the source and drain metallization 190, 195 may include etching openings 192 and 197 in the third etch stop layer 268, and in other embodiments, any dielectric layers deposited after the third etch stop layer 268, and then forming the source and drain metallization 190, 195 over the openings 192, 197 using any suitable technique (e.g., evaporation, sputtering or plating). The techniques used to form the source and drain metallization 190, 195 are analogous to those used to form the field plate 180, 280 and are not repeated here for the sake of brevity.

FIG. 17A depicts performing step 1700 described in the foregoing to realize the completed GaN HFET device 100 of FIG. 1. FIG. 17B depicts performing step 1702 to realize the completed GaN HFET device 200 of FIG. 2.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

What is claimed is:

1. A semiconductor device comprising:
a semiconductor substrate comprising an upper surface and a channel;
a first dielectric layer disposed over the upper surface of the semiconductor substrate;
a first current-carrying electrode and a second current-carrying electrode formed over the semiconductor substrate, wherein the first current-carrying electrode and the second current-carrying electrode are electrically coupled to the channel;
a control electrode formed over the semiconductor substrate and disposed between the first current-carrying electrode and the second current-carrying electrode, wherein the control electrode is electrically coupled to the channel, and wherein the control electrode includes a first sidewall portion nearer the first current-carrying electrode that extends upward from the first dielectric layer, and the control electrode includes a second sidewall portion nearer the second current-carrying electrode that extends upward from the first dielectric layer;
a conductive element, formed over the first dielectric layer, adjacent the control electrode, and between the control electrode and the second current-carrying electrode, wherein the conductive element further comprises a first region formed directly on the first dielectric layer at a first distance from the upper surface of the semiconductor substrate and a second region formed over the first dielectric layer at a second distance from the upper surface of the semiconductor substrate, and wherein the second distance is greater than the first distance; and
an insulating region formed adjacent the control electrode, wherein the insulating region includes a first portion formed laterally adjacent the first sidewall portion of the control electrode, nearer the first current-carrying electrode, and a second portion formed laterally adjacent the second sidewall portion of the control electrode, nearer the second current-carrying electrode, wherein the first portion and the second portion are formed over the first dielectric layer, and wherein the second portion is formed between the control electrode and the conductive element.

2. The semiconductor device of claim 1, wherein a portion of the conductive element is formed above a portion of the control electrode.

3. The semiconductor device of claim 1, wherein the semiconductor substrate includes a group-III nitride layer.

4. The semiconductor device of claim 1, wherein the first dielectric layer includes silicon nitride and the first portion and the second portion include a material selected from the group consisting of silicon dioxide and tetraethyl orthosilicate.

5. The semiconductor device of claim 1, further comprising a first etch stop layer formed over the first dielectric layer, the control electrode, and between the control electrode and the first portion and the second portion.

6. A semiconductor device comprising:
a semiconductor substrate comprising an upper surface and a channel;
a first dielectric layer disposed over the upper surface of the semiconductor substrate;
a first current-carrying electrode and a second current-carrying electrode formed over the semiconductor substrate, wherein the first current-carrying electrode and the second current-carrying electrode are electrically coupled to the channel;
a control electrode formed over the semiconductor substrate and disposed between the first current-carrying electrode and the second current-carrying electrode, wherein the control electrode is electrically coupled to the channel;
a conductive element, formed over the first dielectric layer, adjacent the control electrode, and between the control electrode and the second current-carrying electrode, wherein the conductive element further comprises a first region formed a first distance from the upper surface of the semiconductor substrate and a second region formed a second distance from the upper surface of the semiconductor substrate;

an insulating region formed adjacent the control electrode, wherein the insulating region includes a first portion formed laterally adjacent a first sidewall portion of the control electrode, nearer the first current-carrying electrode, and a second portion formed laterally adjacent a second sidewall portion of the control electrode, nearer the second current-carrying electrode, wherein the first portion and the second portion are formed over the first dielectric layer, and wherein the second portion is formed between the control electrode and the conductive element;

a first etch stop layer formed over the first dielectric layer, the control electrode, and between the control electrode and the first portion and the second portion; and a second etch stop layer formed over the first etch stop layer and over the first portion and the second portion.

7. The semiconductor device of claim 6, further comprising a second dielectric layer formed over the second etch stop layer and over the control electrode.

8. The semiconductor device of claim 7, further comprising a conductive element opening formed in the second dielectric layer over a portion of the first dielectric layer and over a portion of the insulating region, wherein at least a portion the conductive element is formed within the conductive element opening.

9. The semiconductor device of claim 8, wherein an inside spacer layer is formed on a sidewall of the conductive element opening.

10. The semiconductor device of claim 1, wherein the first current-carrying electrode is configured as a source electrode, the second current-carrying electrode is configured as a drain electrode, the control electrode is configured as a gate electrode, and the conductive element is configured as a field plate.

11. A gallium nitride field effect transistor device comprising:
a semiconductor substrate, comprising gallium nitride and further comprising an upper surface and a channel;
a first dielectric layer disposed over the upper surface of the semiconductor substrate;
a source electrode and a drain electrode formed over the semiconductor substrate, wherein the source electrode and the drain electrode are electrically coupled to the channel;
a gate electrode formed over the semiconductor substrate and disposed between the source electrode and the drain electrode, wherein the gate electrode is electrically coupled to the channel, and wherein the gate electrode includes a first sidewall portion nearer the source electrode that extends upward from the first dielectric layer, and the gate electrode includes a second sidewall portion nearer the drain electrode that extends upward from the first dielectric layer;
a field plate, formed over the first dielectric layer, adjacent the gate electrode, and between the gate electrode and the drain electrode, wherein the field plate further comprises a first region formed directly on the first dielectric layer at a first distance from the upper surface of the semiconductor substrate, and a second region formed over the first dielectric layer at a second distance from the upper surface of the semiconductor substrate, wherein the first region, the first dielectric layer, and the semiconductor substrate form portions of a first metal-insulator semiconductor region, the second region, the first dielectric layer, and the semiconductor substrate form portions of a second metal-insulating semiconductor region, and the second distance is greater than the first distance; and a spacer region formed over the first dielectric layer adjacent the gate electrode, wherein the spacer region includes a first portion formed laterally adjacent the first sidewall portion of the gate electrode nearer the source electrode and a second portion formed laterally adjacent the second sidewall portion of the gate electrode, nearer the drain electrode.

12. The gallium nitride field effect transistor device of claim 11, wherein the first portion and the second portion are formed over the first dielectric layer, and wherein the second portion is formed between the gate electrode and the field plate.

13. A gallium nitride field effect transistor device comprising:
a semiconductor substrate, comprising gallium nitride and further comprising an upper surface and a channel;
a first dielectric layer disposed over the upper surface of the semiconductor substrate;
a source electrode and a drain electrode formed over the semiconductor substrate, wherein the source electrode and the drain electrode are electrically coupled to the channel;
a gate electrode formed over the semiconductor substrate and disposed between the source electrode and the drain electrode, wherein the gate electrode is electrically coupled to the channel;
a field plate, formed over the first dielectric layer, adjacent the gate electrode, and between the gate electrode and the drain electrode, wherein the field plate further comprises a first region formed a first distance from the upper surface of the semiconductor substrate, forming a first metal-insulator semiconductor region, and a second region formed a second distance from the upper surface of the semiconductor substrate, forming a second metal-insulating semiconductor region;
a spacer region formed adjacent the gate electrode, wherein the spacer region includes a first portion formed laterally adjacent a first sidewall portion of the gate electrode nearer the source electrode and a second portion formed laterally adjacent a second sidewall portion of the gate electrode, nearer the drain electrode, wherein the first portion and the second portion are formed over the first dielectric layer, and wherein the second portion is formed between the gate electrode and the field plate;
a first etch stop layer formed over the first dielectric layer and the gate electrode, and between the gate electrode and the spacer region; and
a second etch stop layer formed over the first etch stop layer and over the spacer region.

14. The semiconductor device of claim 13, further comprising:
a second dielectric layer formed over the second etch stop layer and over the gate electrode; and
a field plate opening formed in the second dielectric layer, wherein at least a portion the field plate is formed within the field plate opening.

15. The semiconductor device of claim 14, wherein an inside spacer region is formed on a sidewall of the field plate opening and over at least a portion of the spacer region.

16. A method for forming a gallium nitride field effect transistor device comprising:
- forming a semiconductor substrate, comprising gallium nitride and further comprising an upper surface and a channel;
- forming a first dielectric layer over the upper surface of the semiconductor substrate;
- forming a source electrode and a drain electrode over the semiconductor substrate, wherein the source electrode and the drain electrode are electrically coupled to the channel;
- forming a gate electrode over the semiconductor substrate between the source electrode and the drain electrode, wherein the gate electrode is electrically coupled to the channel, and wherein the gate electrode includes a first sidewall portion nearer the source electrode that extends upward from the first dielectric layer, and the gate electrode includes a second sidewall portion nearer the drain electrode that extends upward from the first dielectric layer;
- forming a field plate over the first dielectric layer, adjacent the gate electrode, and between the gate electrode and the drain electrode, wherein forming the field plate further comprises:
  - forming a first region directly on the first dielectric layer, parallel to the upper surface and a first distance from the upper surface of the semiconductor substrate, wherein the first region, the first dielectric layer, and the semiconductor substrate form portions of a first metal-insulator semiconductor region; and
  - forming a second region, parallel to the upper surface and a second distance from the upper surface of the semiconductor substrate, wherein the second region, the first dielectric layer, and the semiconductor substrate form portions of a second metal-insulating semiconductor region, and wherein the second distance is greater than the first distance; and
- forming a spacer region adjacent the gate electrode, wherein forming the spacer region includes a first portion formed laterally adjacent the first sidewall portion of the gate electrode nearer the source electrode and forming a second portion laterally adjacent the second sidewall portion of the gate electrode, nearer the drain electrode.

17. The method of claim 16, wherein the forming the first portion and the second portion includes anisotropically etching a blanket dielectric layer.

18. The method of claim 17, further comprising:
- forming a first etch stop layer over the first dielectric layer and the gate electrode, and between the gate electrode and the second portion; and
- forming a second etch stop layer over the first etch stop layer and over the first portion and the second portion.

19. The semiconductor device of claim 18, further comprising:
- forming a second dielectric layer over the second etch stop layer and over the gate electrode; and
- forming a field plate opening in the second dielectric layer, wherein at least a portion the field plate is formed within the field plate opening.

20. The semiconductor device of claim 19, further comprising forming an inside spacer layer on a sidewall of the field plate opening and over at least a portion of the spacer region.

* * * * *